US012363891B2

(12) United States Patent
Hong et al.

(10) Patent No.: US 12,363,891 B2
(45) Date of Patent: Jul. 15, 2025

(54) SEMICONDUCTOR DEVICE AND METHOD OF FABRICATING THE SAME

(71) Applicant: Samsung Electronics Co., Ltd., Suwon-si (KR)

(72) Inventors: Jiseok Hong, Suwon-si (KR); Sung-Jin Yeo, Yongin-si (KR); Yoongi Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 430 days.

(21) Appl. No.: 17/862,638

(22) Filed: Jul. 12, 2022

(65) Prior Publication Data

US 2023/0225117 A1 Jul. 13, 2023

(30) Foreign Application Priority Data

Jan. 7, 2022 (KR) .................. 10-2022-0002824

(51) Int. Cl.
*H10B 12/00* (2023.01)
(52) U.S. Cl.
CPC ............ *H10B 12/50* (2023.02); *H10B 12/09* (2023.02); *H10B 12/315* (2023.02); *H10B 12/34* (2023.02)
(58) Field of Classification Search
CPC ............ H01L 21/76829; H10B 12/053; H10B 12/315; H10B 12/09; H10B 12/50
See application file for complete search history.

(56) References Cited

U.S. PATENT DOCUMENTS

| 8,928,073 | B2 | 1/2015 | Jang et al. |
| 10,269,808 | B2 | 4/2019 | Kim et al. |
| 11,227,865 | B2 | 1/2022 | Huang |
| 11,469,319 | B2 | 10/2022 | Tsai |
| 2009/0325356 | A1 | 12/2009 | Shin et al. |
| 2017/0323893 | A1* | 11/2017 | Kim ................ H10B 12/34 |
| 2018/0158871 | A1 | 6/2018 | Lee et al. |
| 2019/0273083 | A1* | 9/2019 | Liou ................ H10B 12/01 |

(Continued)

FOREIGN PATENT DOCUMENTS

| CN | 113517290 A | 10/2021 |
| KR | 10-2006-0033961 A | 4/2006 |

(Continued)

*Primary Examiner* — Edward Chin
(74) *Attorney, Agent, or Firm* — Harness, Dickey & Pierce, P.L.C.

(57) ABSTRACT

A semiconductor device includes a substrate including cell and core regions respectively having first and second active patterns having respective, opposing sidewall surfaces at least partially defining a trench therebetween, and a boundary region between the cell and core regions, a device isolation layer on the boundary region to fill the trench, a line structure on the first active pattern and extended from the cell region to the boundary region, and a capping pattern covering an end of the line structure on the boundary region. The device isolation layer includes one or more inner surfaces at least partially defining a recess region, which is adjacent to the end of the line structure, and the capping pattern is extended along the end of the line structure into the recess region. A top surface of the device isolation layer is between the line structure and a bottom surface of the capping pattern.

20 Claims, 45 Drawing Sheets

(56) References Cited

U.S. PATENT DOCUMENTS

| | | |
|---|---|---|
| 2021/0118886 A1 | 4/2021 | Choi et al. |
| 2021/0183769 A1 | 6/2021 | Ha |
| 2022/0028868 A1* | 1/2022 | Kim .................. H10B 12/50 |

FOREIGN PATENT DOCUMENTS

| | | |
|---|---|---|
| KR | 10-2011-0078132 A | 7/2011 |
| TW | 202131391 A | 8/2021 |

\* cited by examiner

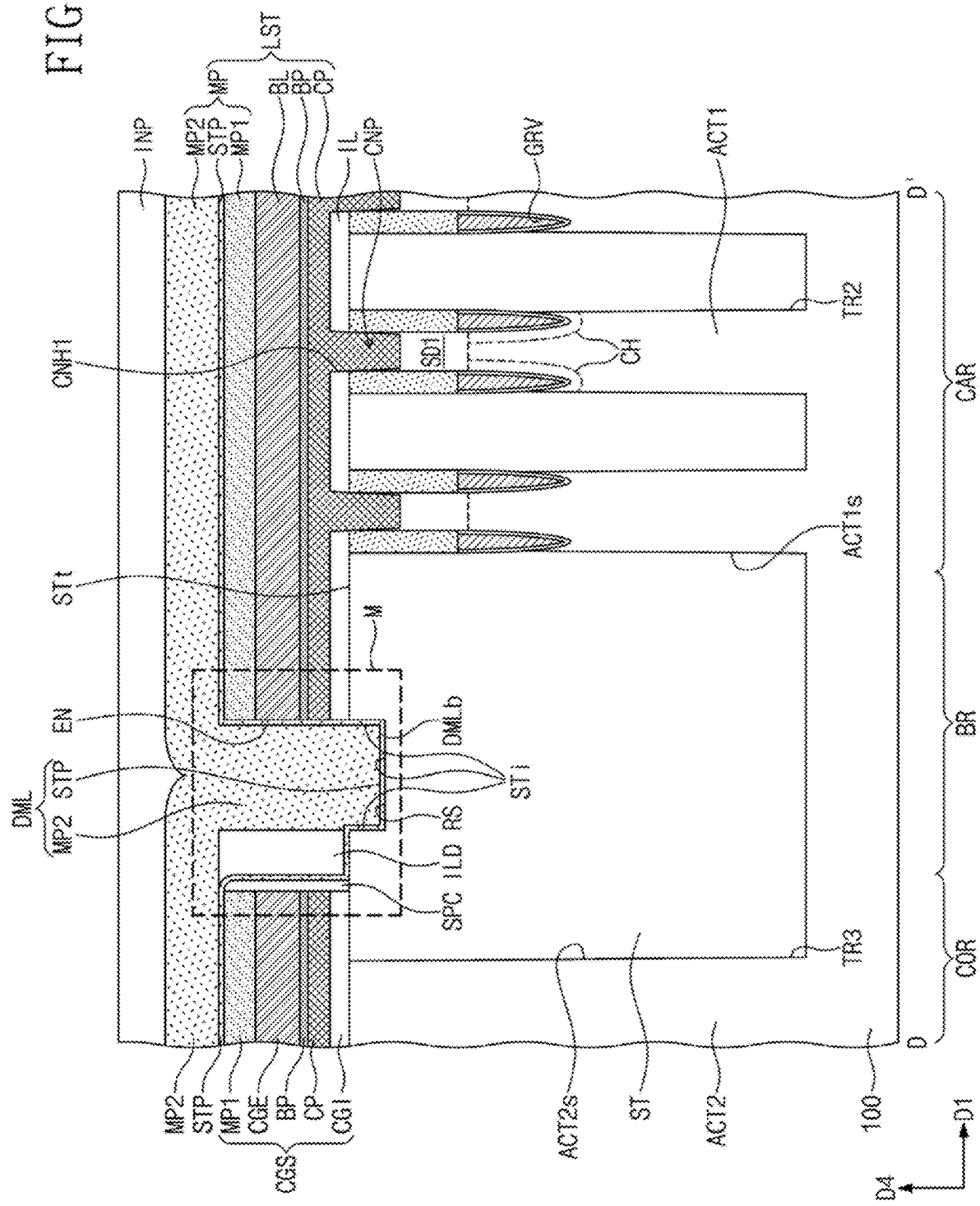

SEMICONDUCTOR DEVICE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2022-0002824, filed on Jan. 7, 2022, in the Korean Intellectual Property Office, the entire contents of which are hereby incorporated by reference.

BACKGROUND

The present inventive concepts relate to semiconductor devices and methods of fabricating the same, and in particular, to semiconductor memory devices with improved reliability and methods of fabricating the same.

Due to their small-size, multifunctionality, and/or low-cost characteristics, semiconductor devices are considered important elements in the electronic industry. A memory device, which is one of the semiconductor devices, is configured to store logical data. With the development of the electronics industry, the memory device is becoming more highly integrated. As a result, linewidths of elements constituting the memory device are decreasing.

Higher reliability, in addition to the higher integration density, is required for the memory device. However, an increase in integration density of the memory device may cause deterioration in reliability of the memory device. Thus, many studies are being conducted to improve the reliability of the memory device.

SUMMARY

Some example embodiments of the inventive concepts provides a semiconductor memory device with improved reliability.

Some example embodiments of the inventive concepts provides a method of fabricating a semiconductor memory device with improved reliability.

According to some example embodiments of the inventive concepts, a semiconductor device may include a substrate including a cell region including a first active pattern, a core region including a second active pattern, and a boundary region between the cell region and the core region, wherein the first active pattern and the second active pattern have respective, opposing sidewall surfaces at least partially defining a trench between the first active pattern and the second active pattern, a device isolation layer on the boundary region, the device isolation layer filling the trench between the first active pattern and the second active pattern, a line structure on the first active pattern, the line structure extended from the cell region to the boundary region, and a capping pattern covering an end of the line structure on the boundary region. The device isolation layer may include one or more inner surfaces at least partially defining a recess region, which is adjacent to the end of the line structure, and the capping pattern may be extended along the end of the line structure into the recess region. A top surface of the device isolation layer may be between the line structure and a bottom surface of the capping pattern.

According to some example embodiments of the inventive concepts, a semiconductor device may include a substrate including a cell region including a first active pattern, a core region including a second active pattern, and a boundary region between the cell region and the core region, wherein the first active pattern and the second active pattern have respective, opposing sidewall surfaces at least partially defining a trench between the first active pattern and the second active pattern, a device isolation layer on the boundary region, the device isolation layer filling the trench between the first active pattern and the second active pattern, a line structure on the first active pattern, the line structure extended from the cell region to the boundary region, a core gate structure on the second active pattern, a sidewall spacer on the boundary region to cover a side surface of the core gate structure, and a capping pattern on the boundary region to cover an end of the line structure. The capping pattern may include a material different from a material of the sidewall spacer.

According to some example embodiments of the inventive concepts, a semiconductor device may include a substrate including a cell region including a first active pattern, a core region including a second active pattern, and a boundary region between the cell region and the core region, wherein the first active pattern has a longitudinal axis in a first direction extending parallel to the substrate and includes a first source/drain region and a second source/drain region spaced apart from each other in the first direction, the first source/drain region and the second source/drain region having respective, opposing sidewall surfaces at least partially defining a groove between the first and second source/drain regions of the first active pattern; a gate electrode in the groove defined between the first and second source/drain regions of the first active pattern and is extended in a second direction that is different than the first direction; a gate dielectric layer between the gate electrode and the first active pattern; a gate capping layer on the gate electrode to fill the groove; a device isolation layer on the substrate to define the first active pattern and the second active pattern; a buffer layer on the cell region; a line structure on the buffer layer to cross the first active pattern and extend in a third direction crossing the second direction and is extended from the cell region to the boundary region, the line structure including a first conductive pattern, which penetrates the buffer layer and is coupled to the first source/drain region, a bit line on the first conductive pattern, and a first barrier pattern between the bit line and the first conductive pattern; a pair of spacers, which are respectively on opposite side surfaces of the line structure; a contact plug coupled to the second source/drain region; a landing pad on the contact plug; a data storing element on the landing pad; a core gate structure on the second active pattern, the core gate structure including a second conductive pattern corresponding to the first conductive pattern, a second barrier pattern corresponding to the first barrier pattern, and a core gate electrode corresponding to the bit line; a sidewall spacer on a side surface of the core gate structure; and a capping pattern covering an end of the line structure on the boundary region.

According to some example embodiments of the inventive concepts, a method of fabricating a semiconductor device may include forming a first active pattern on a cell region of a substrate, forming a second active pattern on a core region of the substrate, forming a device isolation layer on a boundary region between the cell region and the core region, forming a plate structure, which includes a conductive layer and has an end located on the boundary region, on the cell region, forming a sidewall spacer on the end of the plate structure, forming a first etch mask pattern to cover the core region and to expose the boundary region and the cell region, selectively removing the sidewall spacer on the end of the plate structure based on performing a first etching process using the first etch mask pattern, forming a mask layer on the plate structure to encapsulate the end of the plate structure, forming a mask pattern in a line shape based on patterning the mask layer, and forming a line structure crossing the first active pattern based on etching the plate structure using the mask pattern as an etch mask.

BRIEF DESCRIPTION OF THE DRAWINGS

FIG. 3D is a sectional view taken along a line D-D' of FIG. 2.

DETAILED DESCRIPTION

Figure 1:
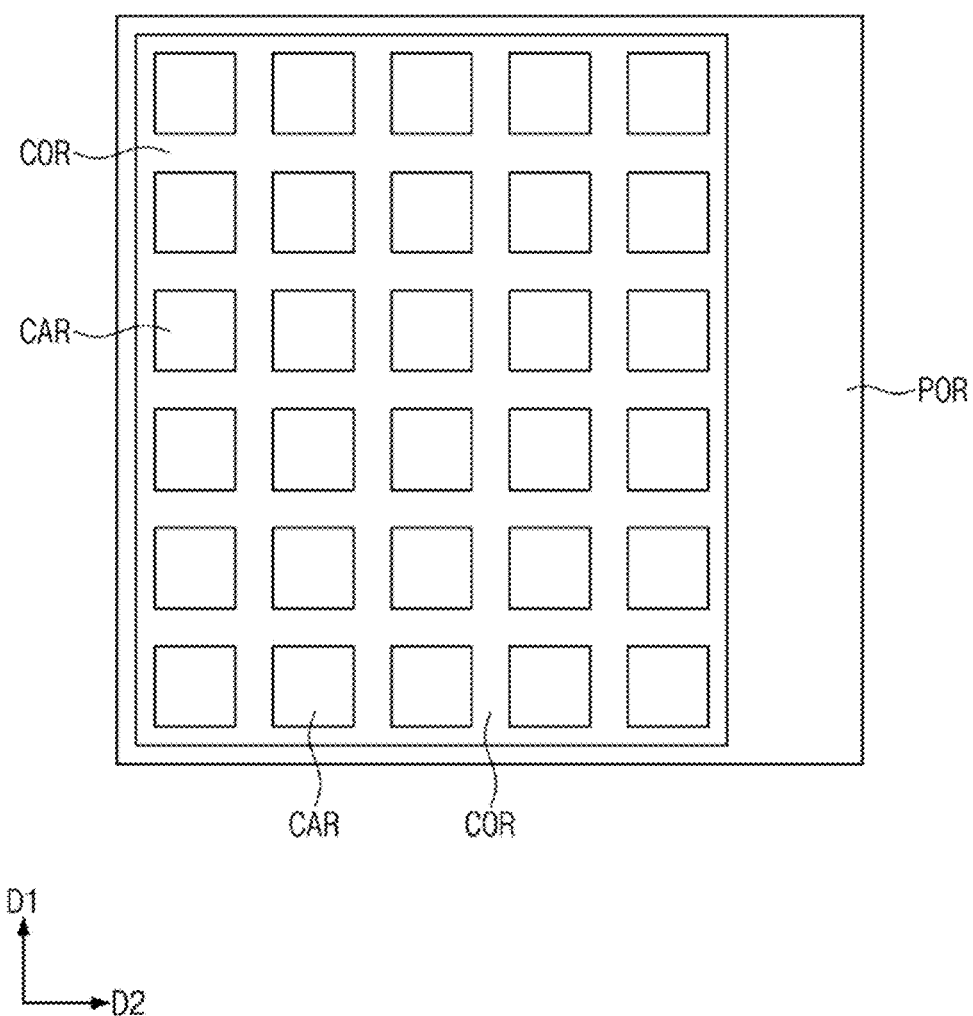
FIG. 1 is a plan view illustrating a semiconductor device according to some example embodiments of the inventive concepts.

Example embodiments of the inventive concepts will now be described more fully with reference to the accompanying drawings, in which some example embodiments are shown.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1 is a plan view illustrating a semiconductor device according to some example embodiments of the inventive concepts. A semiconductor device 10 may include cell regions CAR. The cell regions CAR may be regions including a plurality of memory cells, and each of the cell regions CAR may be used as a single unit cell block. The cell regions CAR may be spaced apart from each other in a first direction D1 and a second direction D2. As shown, the first direction D1 may extend parallel to the substrate 100 (e.g., parallel to a top surface of the substrate 100, parallel to a bottom surface of the substrate 100, parallel to a plane that is defined by the substrate, etc.). As shown, the second direction D2 may be different from (e.g., perpendicular to) the first direction and may extend parallel to the substrate 100 (e.g., parallel to a top surface of the substrate 100, parallel to a bottom surface of the substrate 100, parallel to a plane that is defined by the substrate, etc.).

A core region COR may be provided between adjacent ones of the cell regions CAR. A sense amplifier and a write driver may be provided in the core region COR. A peripheral circuit region POR may be provided at a side of the cell regions CAR. The peripheral circuit region POR may include a row decoder, a column decoder, and so forth.

Figure 2:
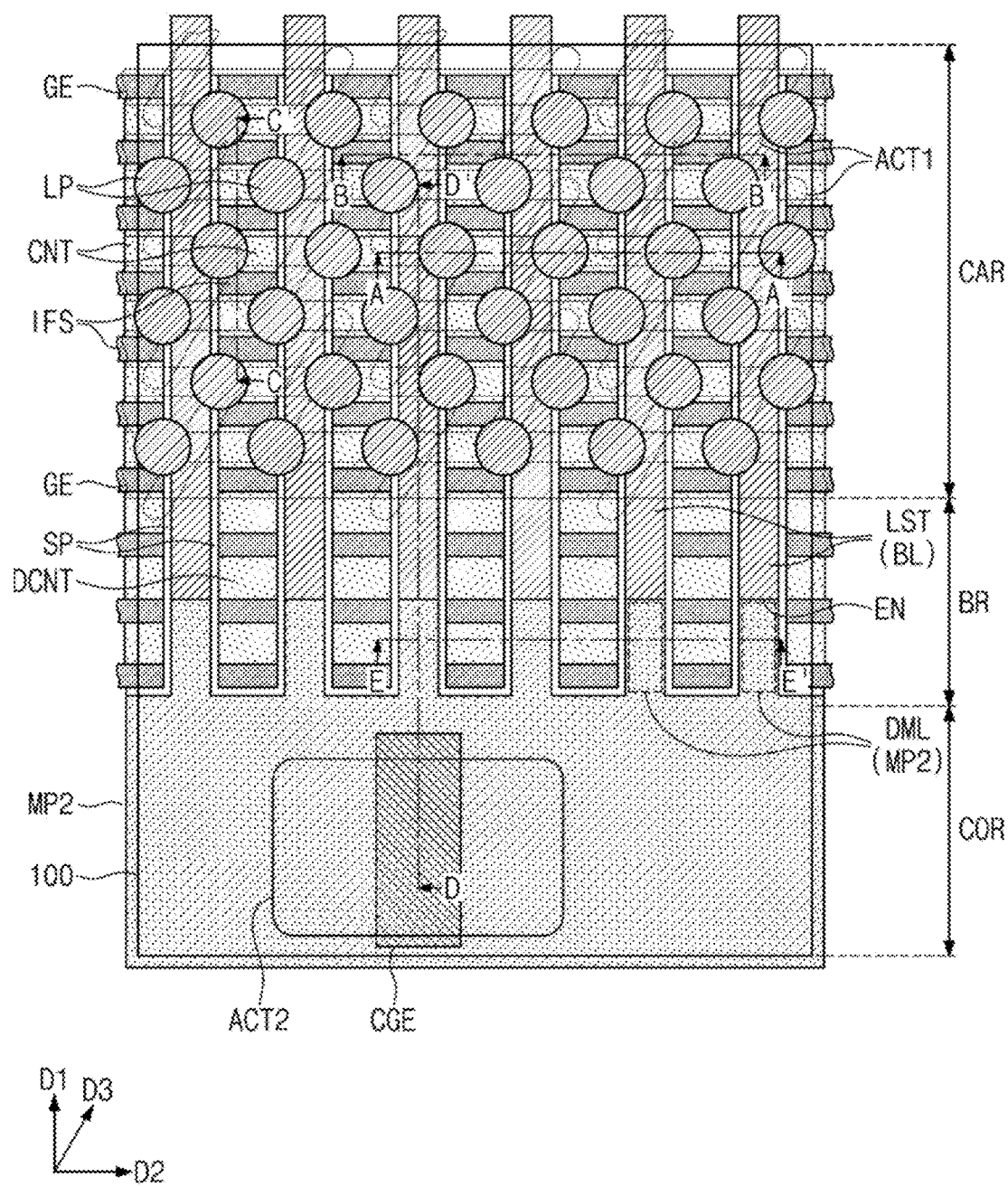
FIG. 2 is an enlarged plan view illustrating a boundary between cell and core regions of FIG. 1.
Figure 3A:
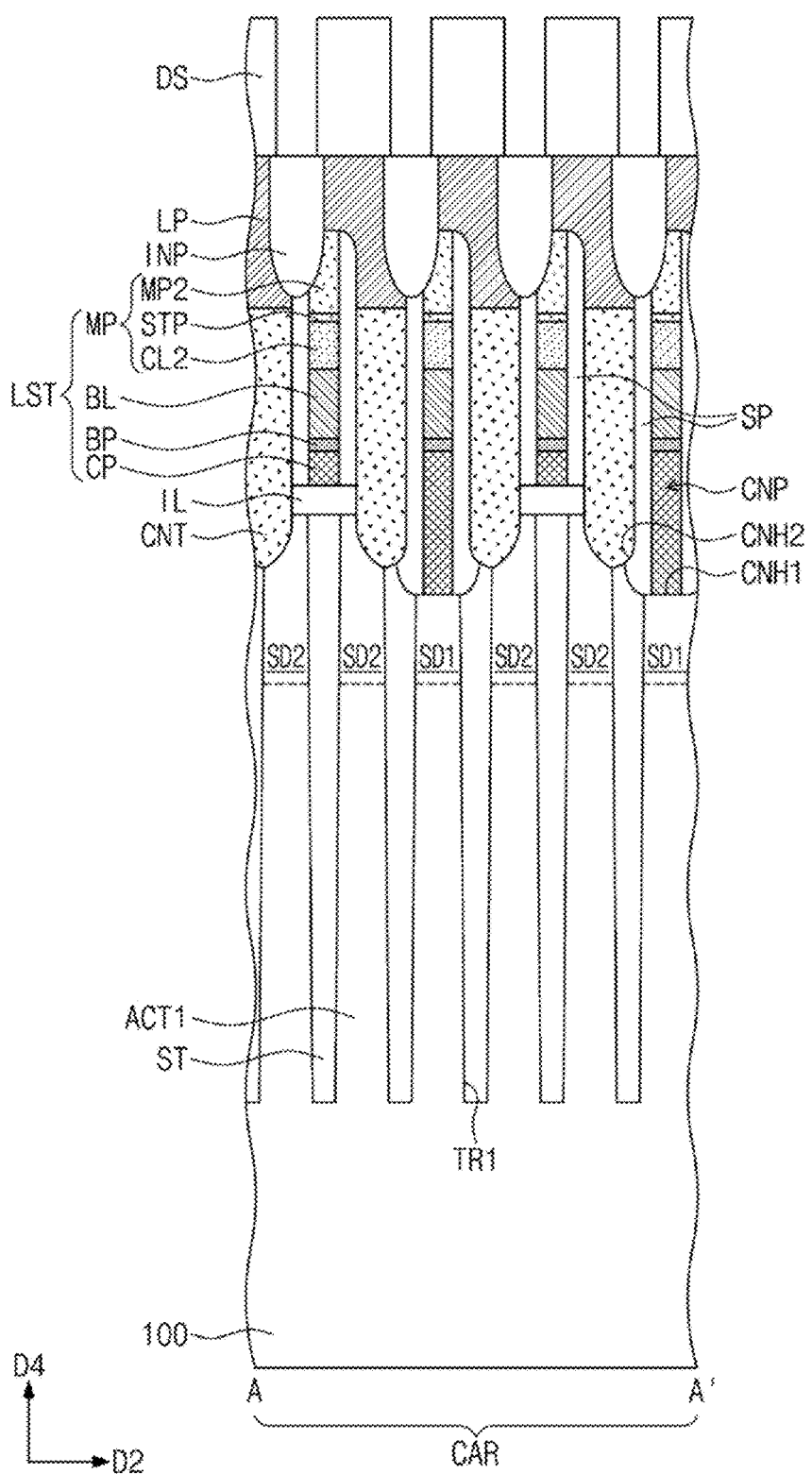
FIG. 3A is a sectional view taken along a line A-A' of FIG. 2.
Figure 3B:
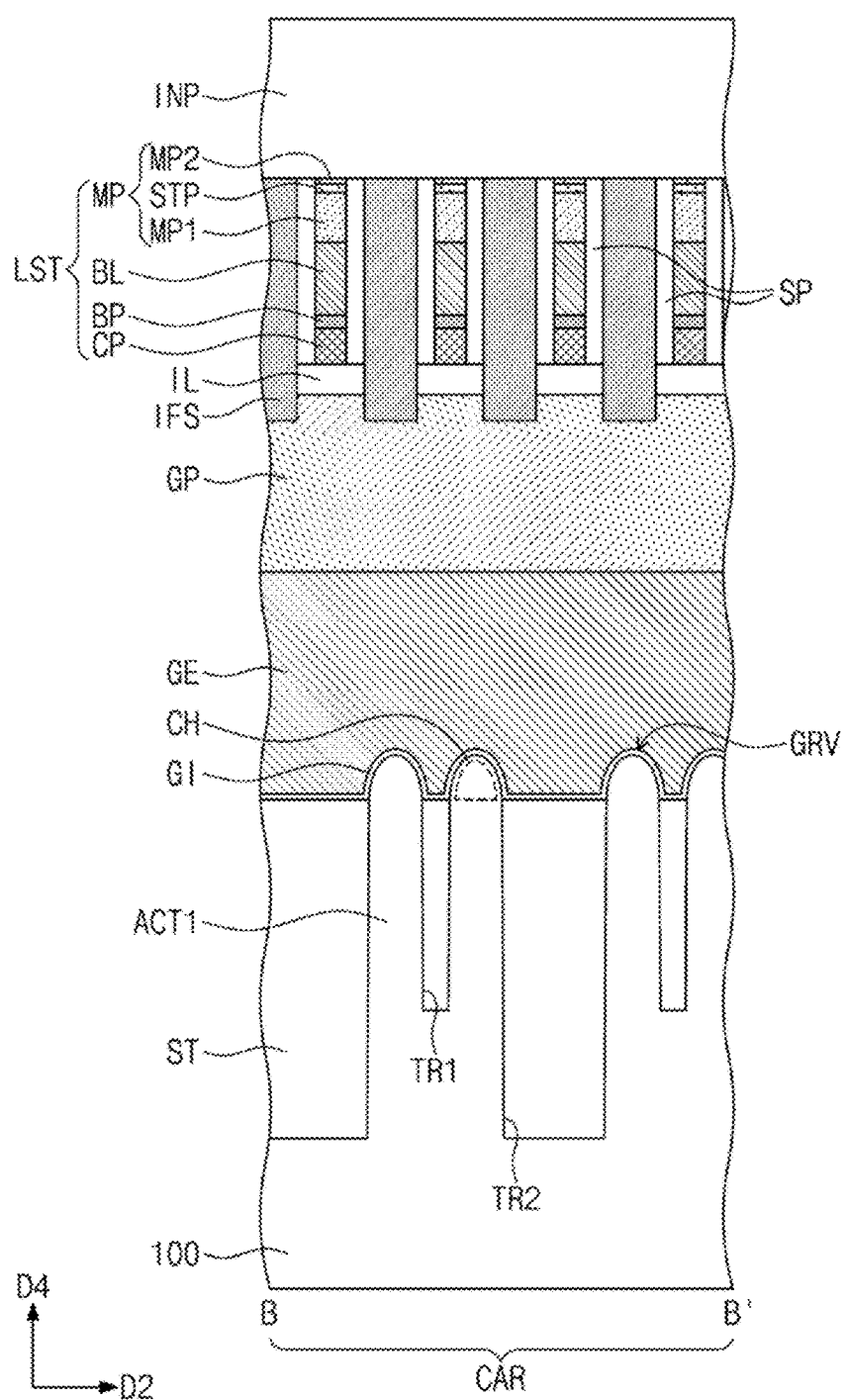
FIG. 3B is a sectional view taken along a line B-B' of FIG. 2.
Figure 3C:
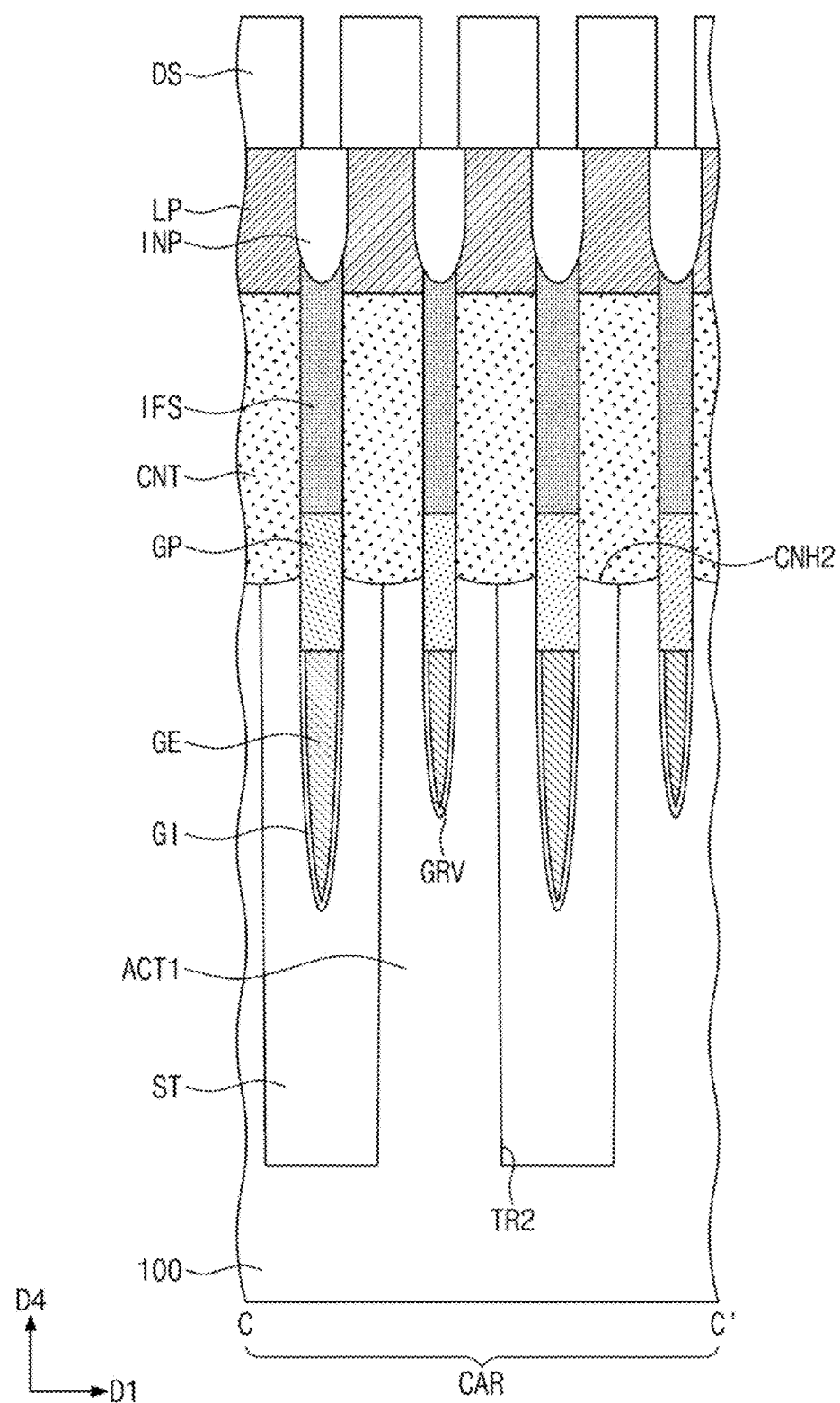
FIG. 3C is a sectional view taken along a line C-C' of FIG. 2.
Figure 3E:
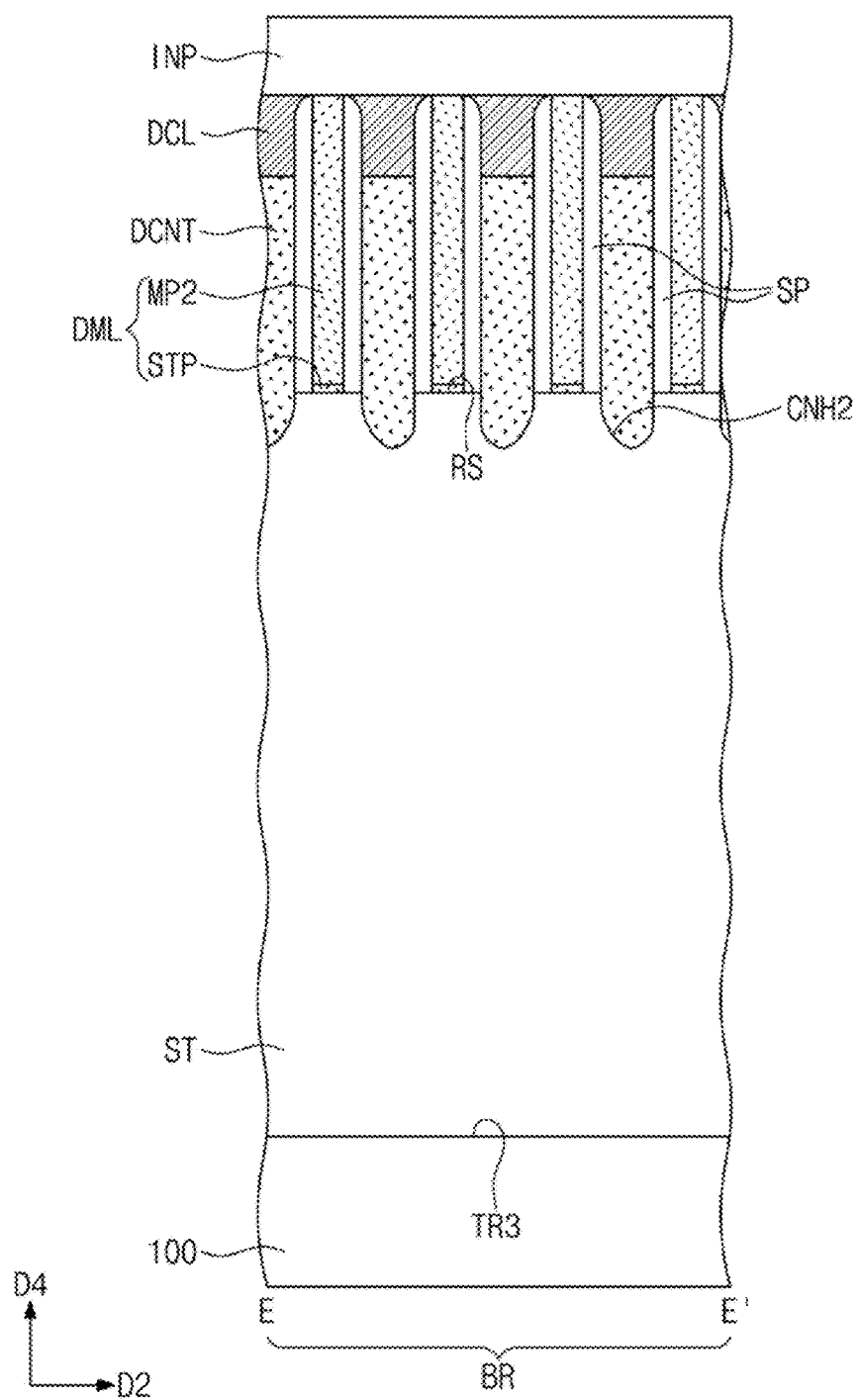
FIG. 3E is a sectional view taken along a line E-E' of FIG. 2.
Figure 4:
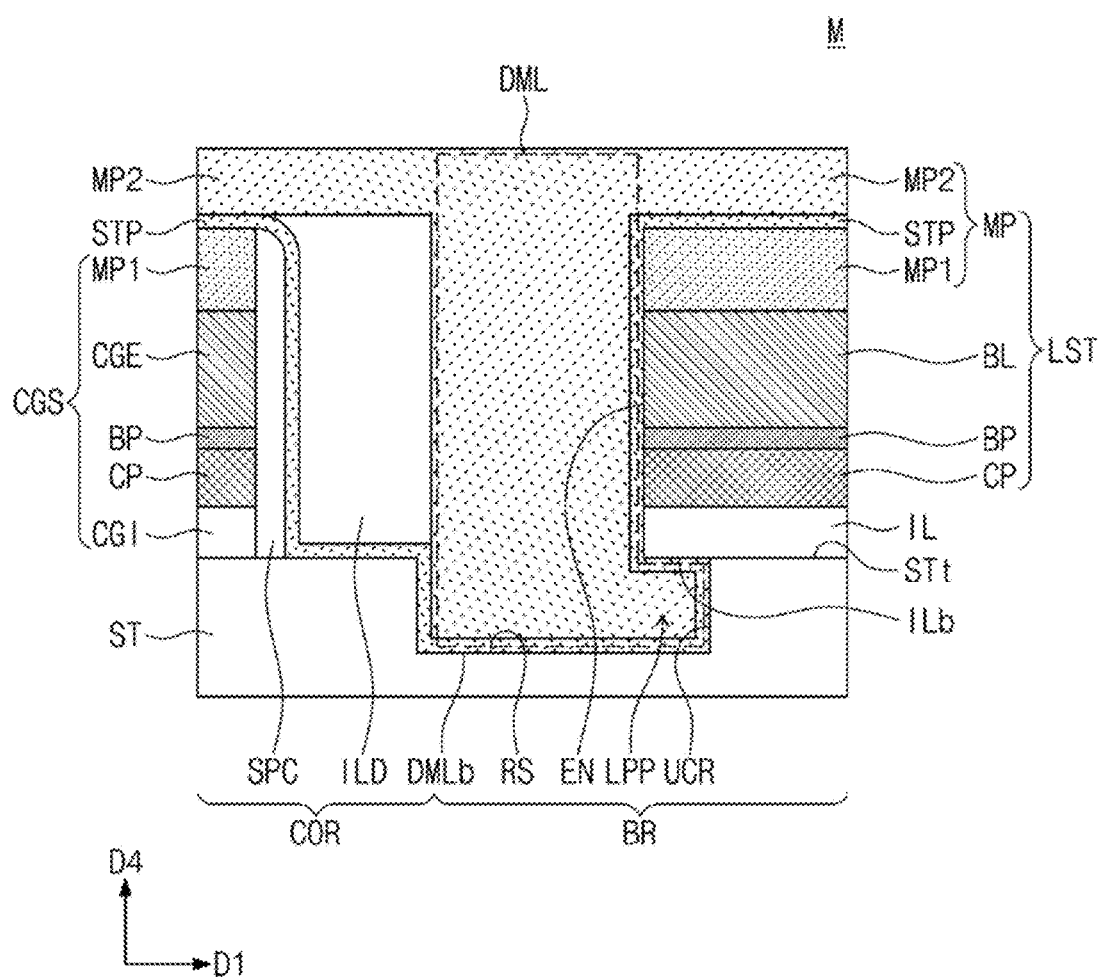
FIG. 4 is an enlarged sectional view illustrating the portion 'M' of FIG. 3D.

FIG. 2 is an enlarged plan view illustrating a boundary between cell and core regions of FIG. 1. FIG. 3A is a sectional view taken along a line A-A' of FIG. 2, FIG. 3B is a sectional view taken along a line B-B' of FIG. 2, FIG. 3C is a sectional view taken along a line C-C' of FIG. 2, FIG. 3D is a sectional view taken along a line D-D' of FIG. 2, and FIG. 3E is a sectional view taken along a line E-E' of FIG. 2. FIG. 4 is an enlarged sectional view illustrating the portion 'M' of FIG. 3D.

Referring to FIG. 2, a substrate 100, which includes the cell region CAR, a boundary region BR, and the core region COR, may be provided. The cell region CAR may be a region, in which a plurality of memory cells are provided. The boundary region BR may be interposed between the cell region CAR and the core region COR. The boundary region BR may be a buffer region which is provided to relieve technical difficulties in a process of fabricating different structures on the cell and core regions CAR and COR. The boundary region BR may be configured to connect the structure on the cell region CAR to the structure on the core region COR.

The substrate 100 may be a bulk silicon substrate, a silicon-on-insulator (SOI) substrate, a germanium substrate, a germanium-on-insulator (GOI) substrate, a silicon-germanium substrate, or a substrate including an epitaxial layer grown by a selective epitaxial growth (SEG) technique.

Hereinafter, the cell region CAR will be described in more detail with reference to FIGS. 2 and 3A to 3E. A device isolation layer ST may be provided on the cell region CAR of the substrate 100 to define first active patterns ACT1. The first active patterns ACT1 may be formed by patterning an upper portion of the substrate 100. Each of the first active patterns ACT1 may be extended in a third direction D3 that is parallel to a top surface of the substrate 100. In other words, each of the first active patterns ACT1 may have a long axis (e.g., longitudinal axis) parallel to the third direction D3. The first active patterns ACT1 may be two-dimensionally arranged in the first and second directions D1 and D2. The first active patterns ACT1 may be spaced apart from each other in the third direction D3.

Each of the first active patterns ACT1 may have a decreasing width, with increasing height in a direction (i.e., a fourth direction D4) perpendicular to the top surface of the substrate 100. In other words, as a distance from a bottom surface of the substrate 100 increases, the width of each of the first active patterns ACT1 may decrease.

First and second trenches TR1 and TR2 may be defined between the first active patterns ACT1. As shown, the first active patterns ACT1 may include one or more surfaces that at least partially define a first trench TR1 and/or a second trench TR2. As shown, the first trenches TR1 and/or the second trenches TR2 may each be at least partially defined by opposing, respective sidewall surfaces of first active patterns ACT1. The device isolation layer ST may fill the first and second trenches TR1 and TR2 between the first active patterns ACT1. The first trench TR1 may be defined between a pair of the first active patterns ACT1, which are adjacent to each other in the second direction D2. The second trench TR2 may be defined between a pair of the first active patterns ACT1, which are adjacent to each other in the third direction D3.

A distance between the pair of the first active patterns ACT1, which are adjacent to each other in the second direction D2, may be smaller than a distance between the pair of the first active patterns ACT1, which are adjacent to each other in the third direction D3. Accordingly, the second trench TR2 may be deeper than the first trench TR1. In other words, a bottom of the second trench TR2 may be lower than a bottom of the first trench TR1 (e.g., see FIG. 3B).

An upper portion of each of the first active patterns ACT1 may include a first source/drain region SD1 and a pair of second source/drain regions SD2. The first source/drain region SD1 may be located between the pair of the second source/drain regions SD2. In other words, when viewed in a plan view, the second source/drain region SD2, the first source/drain region SD1, and the second source/drain region SD2 may be sequentially arranged in the third direction D3. For example, as shown, each first active pattern ACT1 may have a longitudinal axis (e.g., long axis) in the third direction D3 extending parallel to a top surface of the substrate 100 and may include at least a first source/drain region SD1 and a second source/drain region SD2 that are spaced apart from each other (e.g., isolated from direct contact with each other) in the third direction D3.

Figure 7:
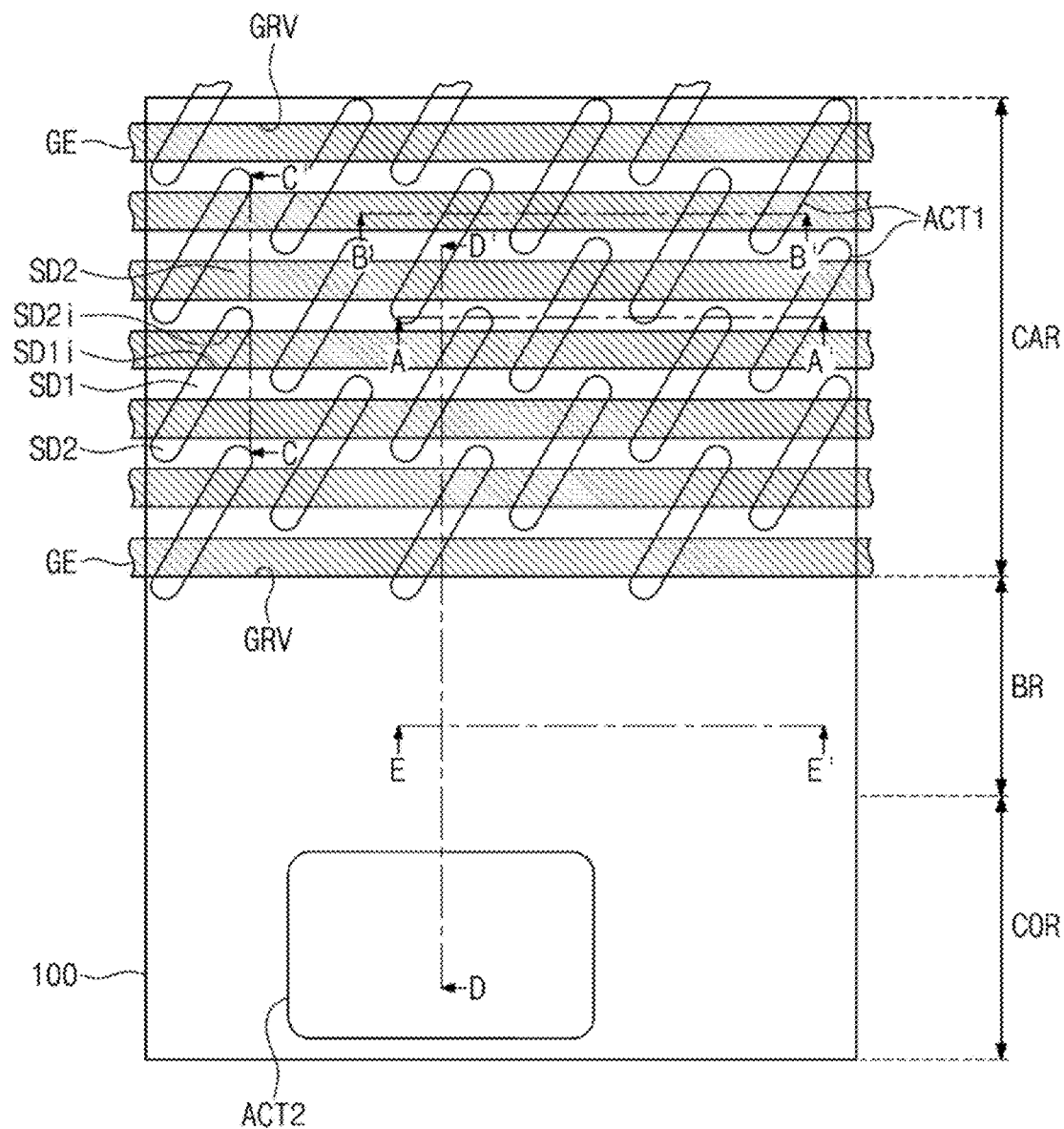
FIGS. 7, 9, 11, 13, and 15 are plan views illustrating a method of fabricating a semiconductor device according to some example embodiments of the inventive concepts.
Figure 8A:
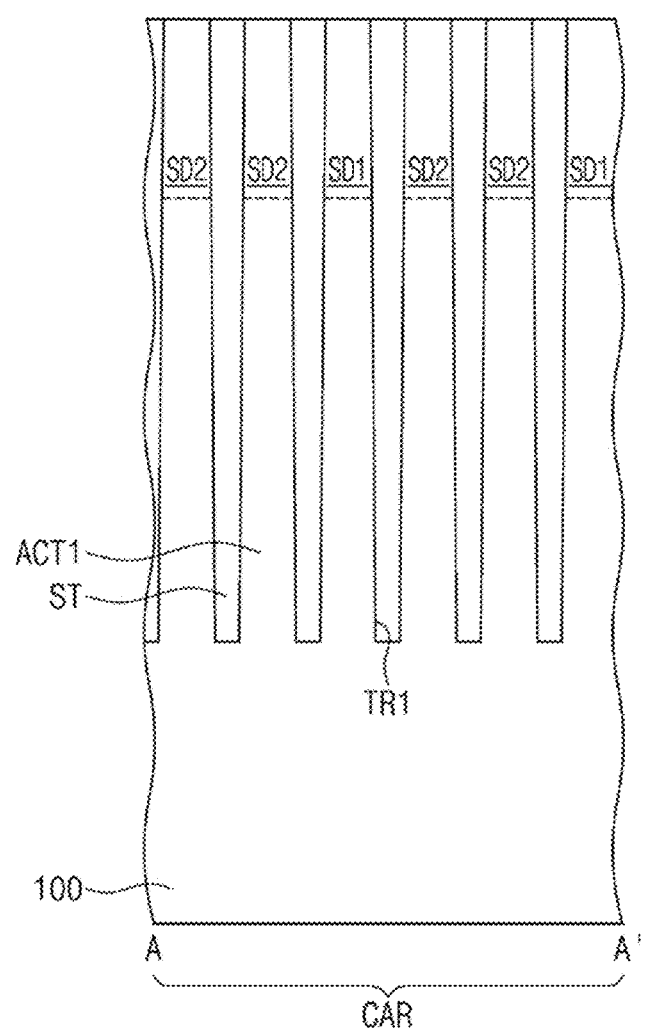
FIGS. 8A, 10A, 12A, 14A, and 16A are sectional views taken along lines A-A' of FIGS. 7, 9, 11, 13, and 15, respectively.
Figure 8B:
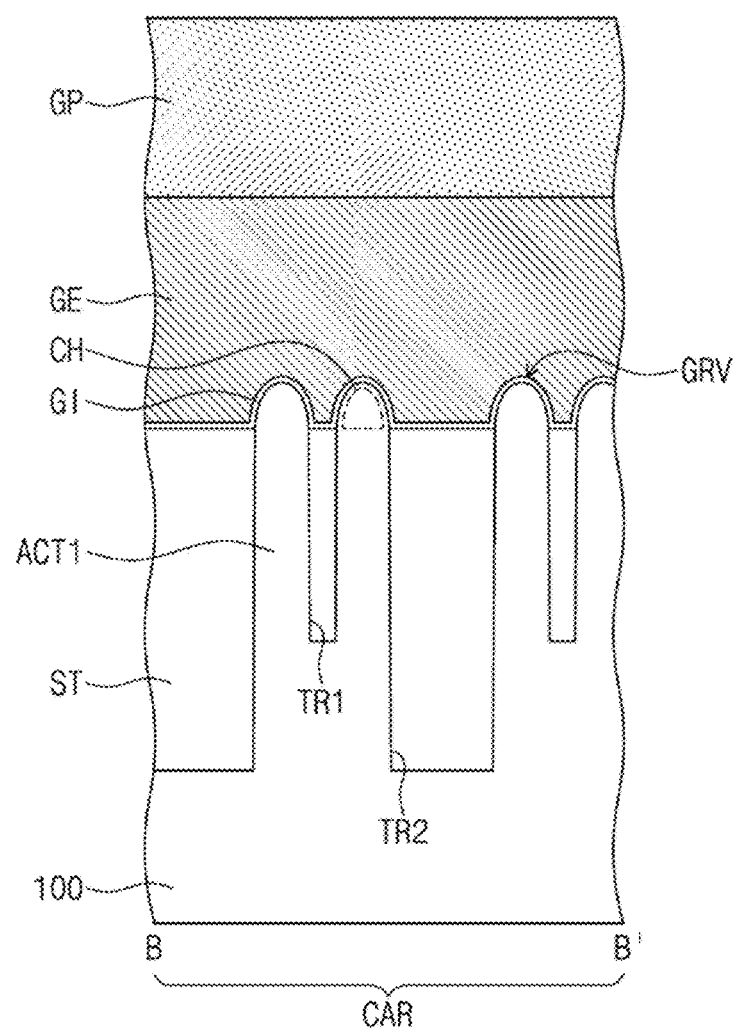
FIGS. 8B, 10B, 12B, 14B, and 16B are sectional views taken along lines B-B' of FIGS. 7, 9, 11, 13, and 15, respectively.
Figure 8C:
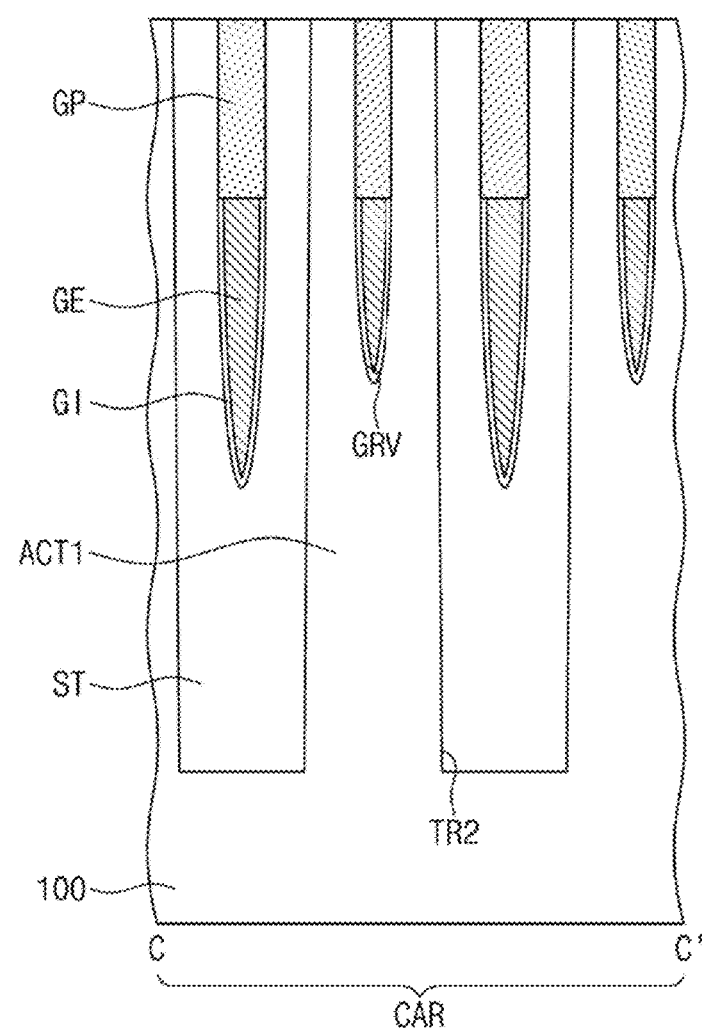
FIGS. 8C, 10C, 12C, 14C, and 16C are sectional views taken along lines C-C' of FIGS. 7, 9, 11, 13, and 15, respectively.
Figure 8D:
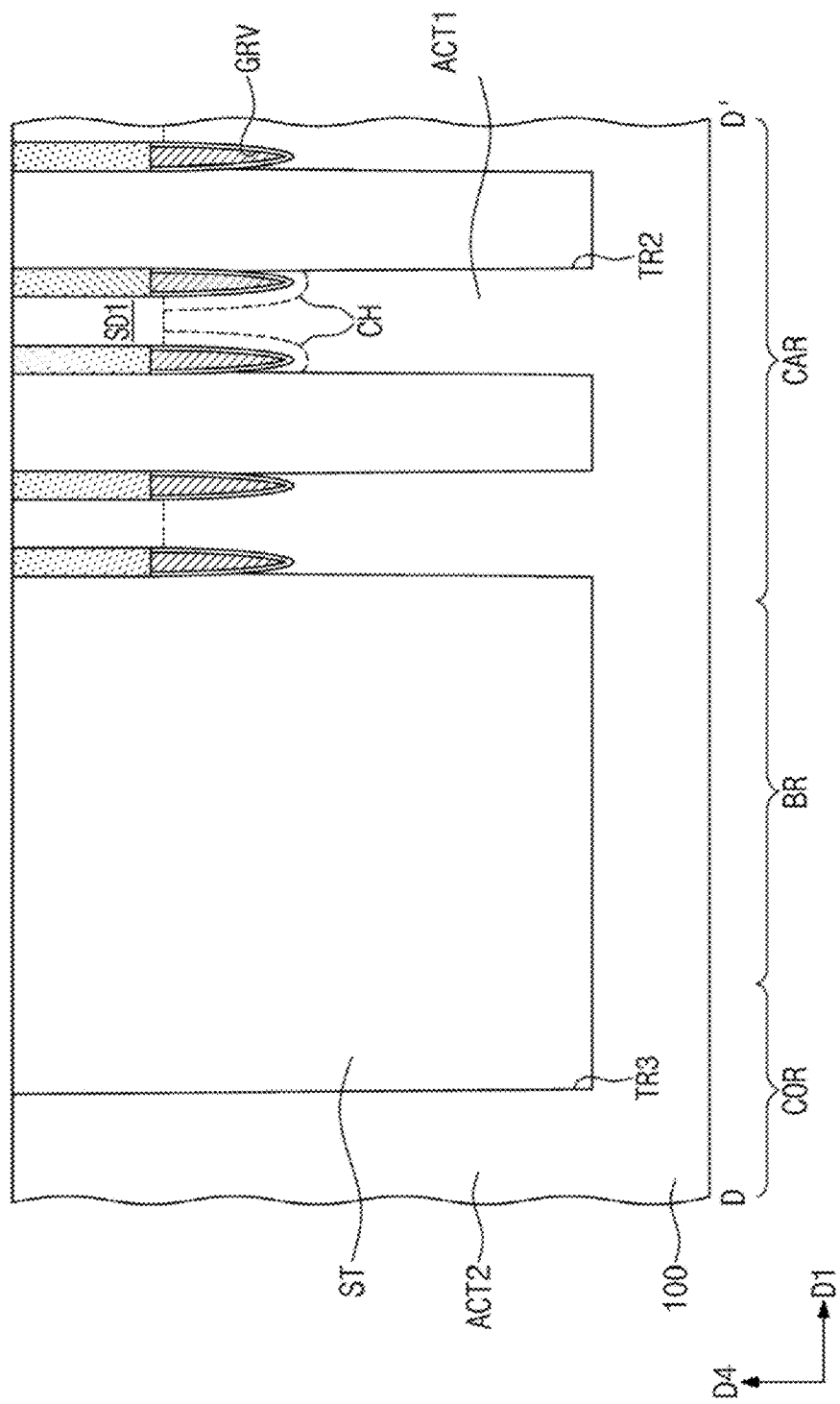
FIGS. 8D, 10D, 12D, 14D, and 16D are sectional views taken along lines D-D' of FIGS. 7, 9, 11, 13, and 15, respectively.
Figure 8E:
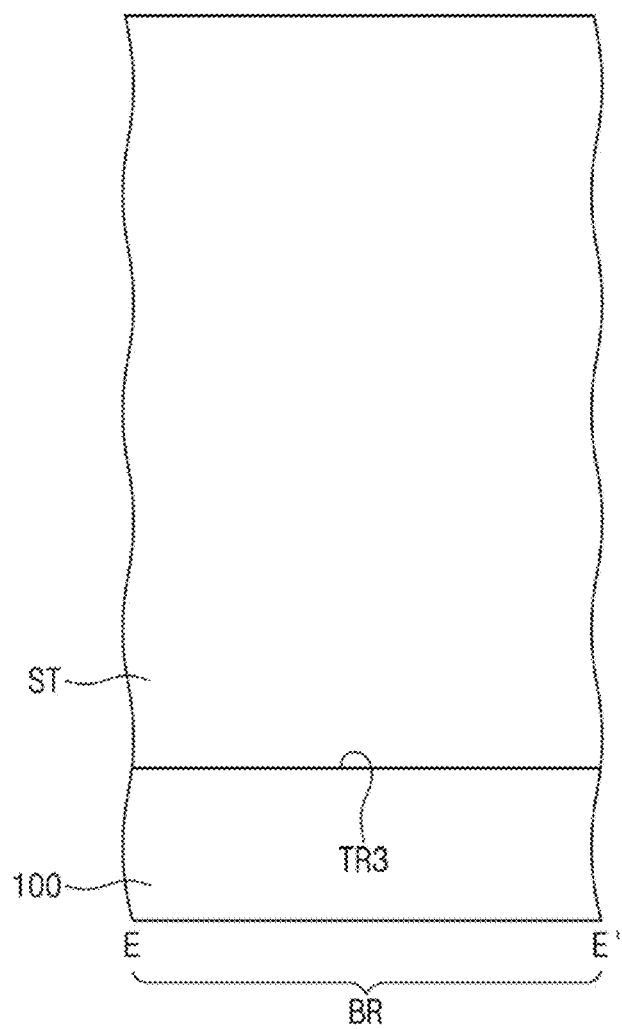
FIGS. 8E, 10E, 12E, 14E, and 16E are sectional views taken along lines E-E' of FIGS. 7, 9, 11, 13, and 15, respectively.
Figure 9:
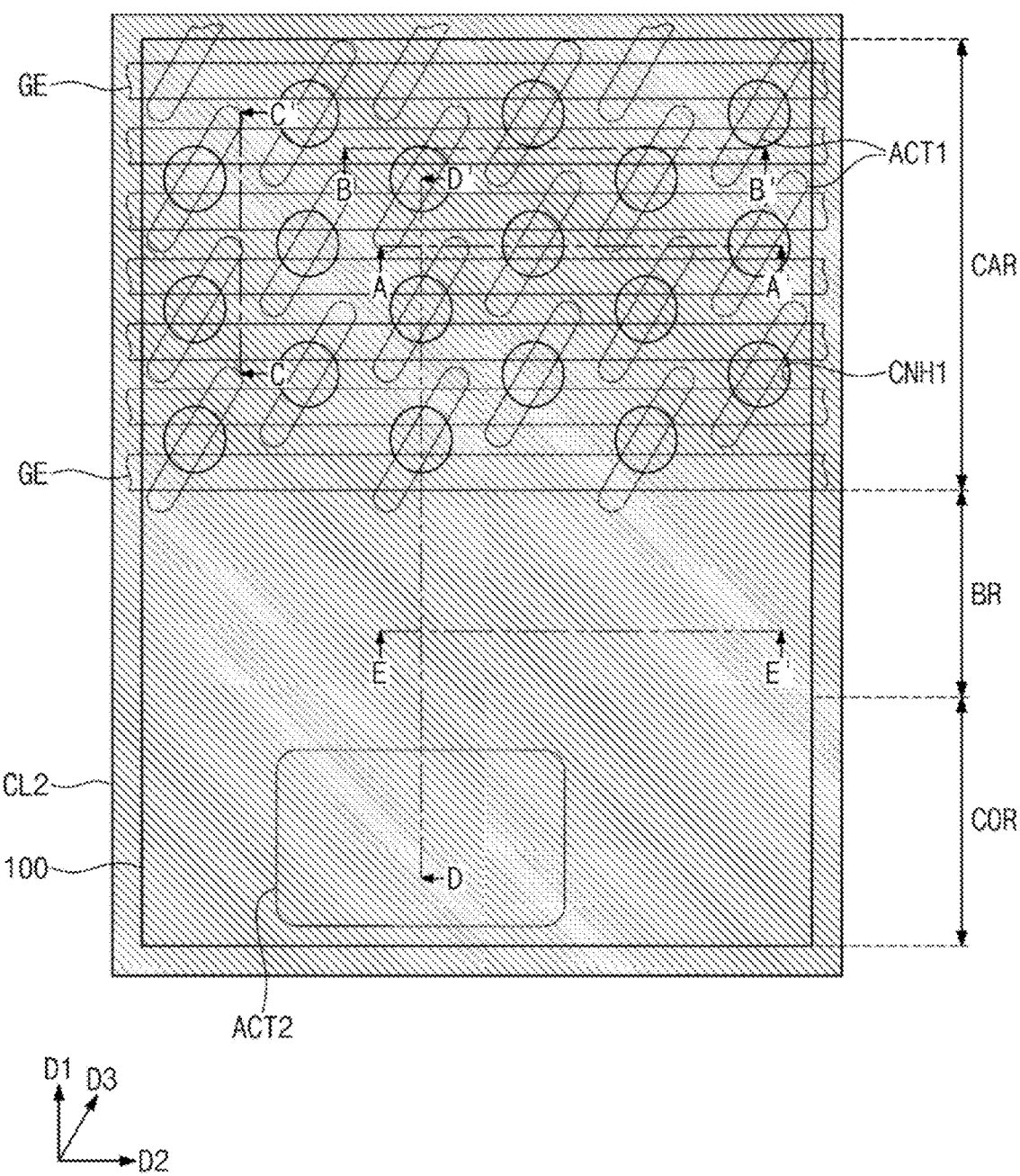
Figure 10A:
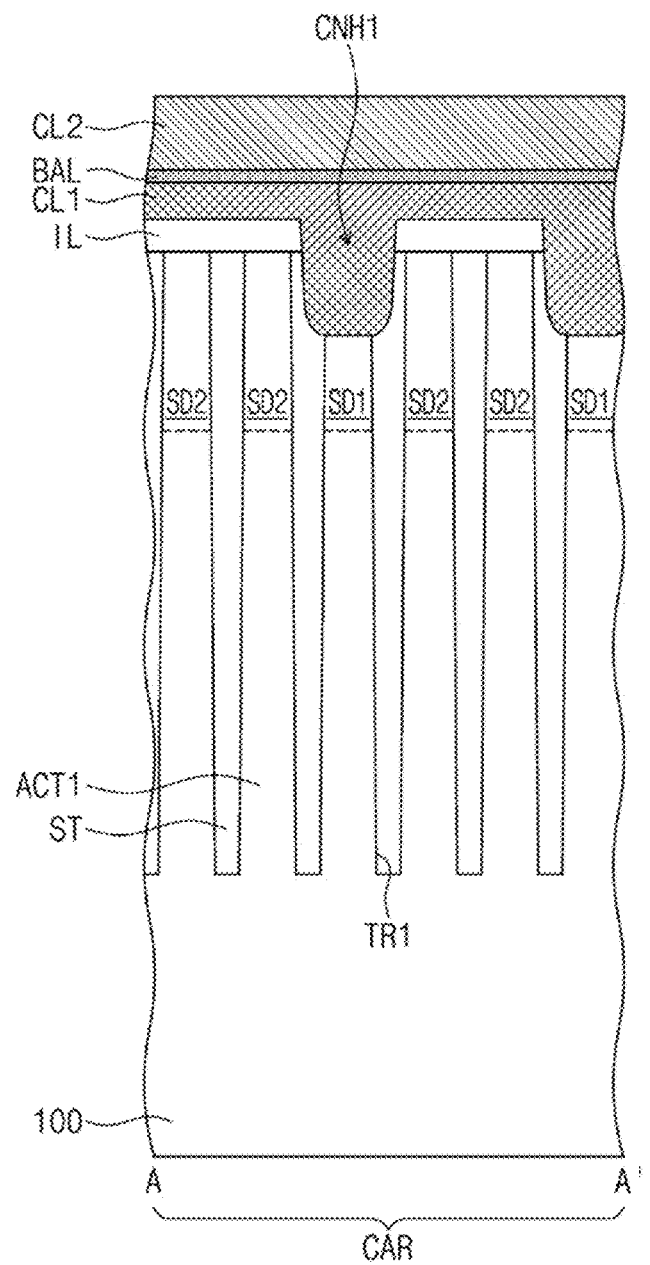
Figure 10B:
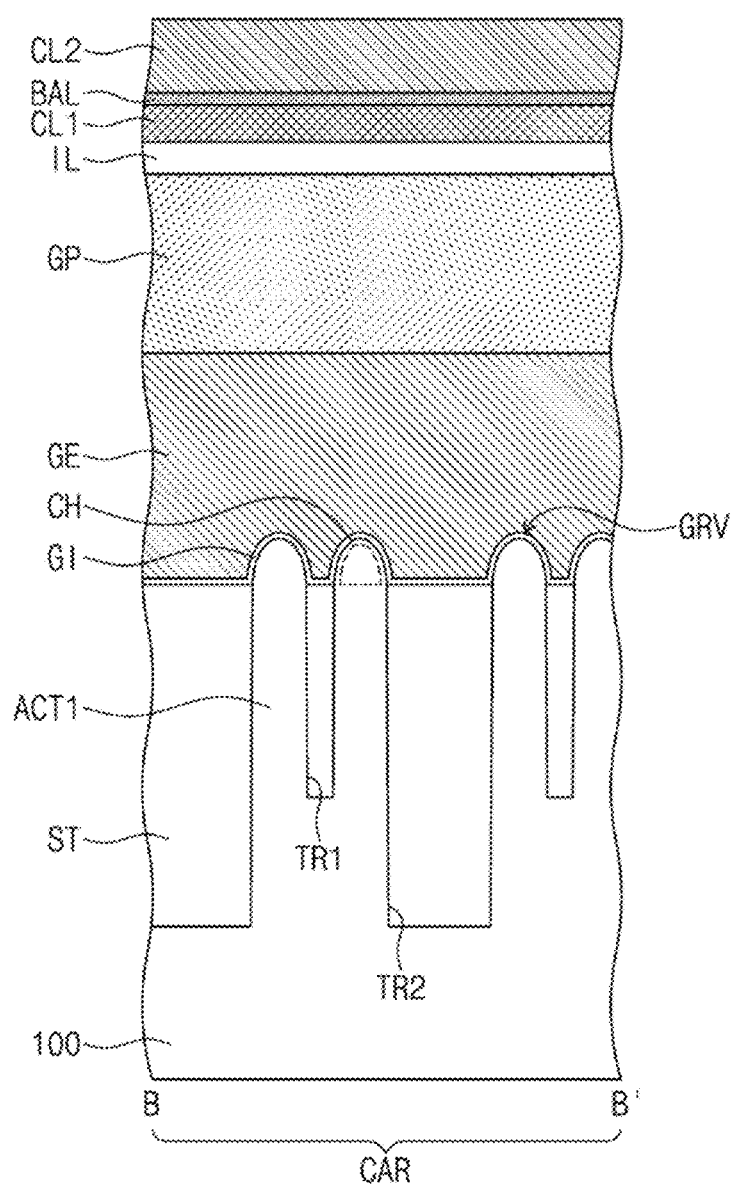
Figure 10C:
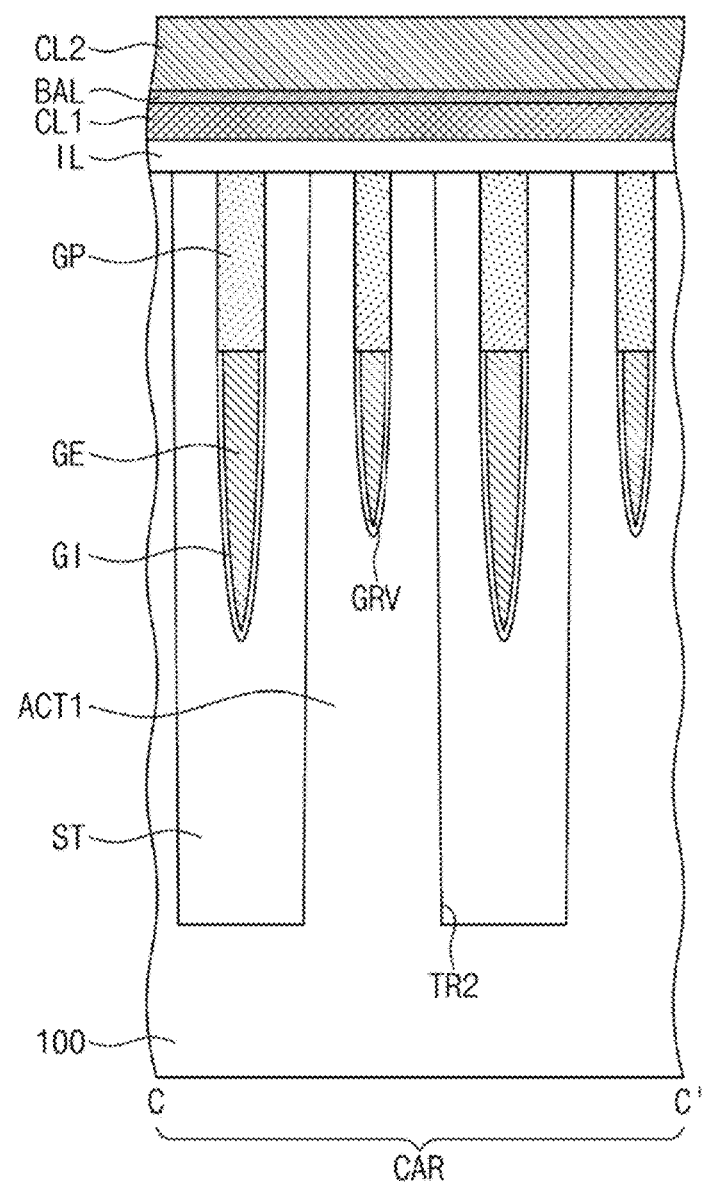
Figure 10D:
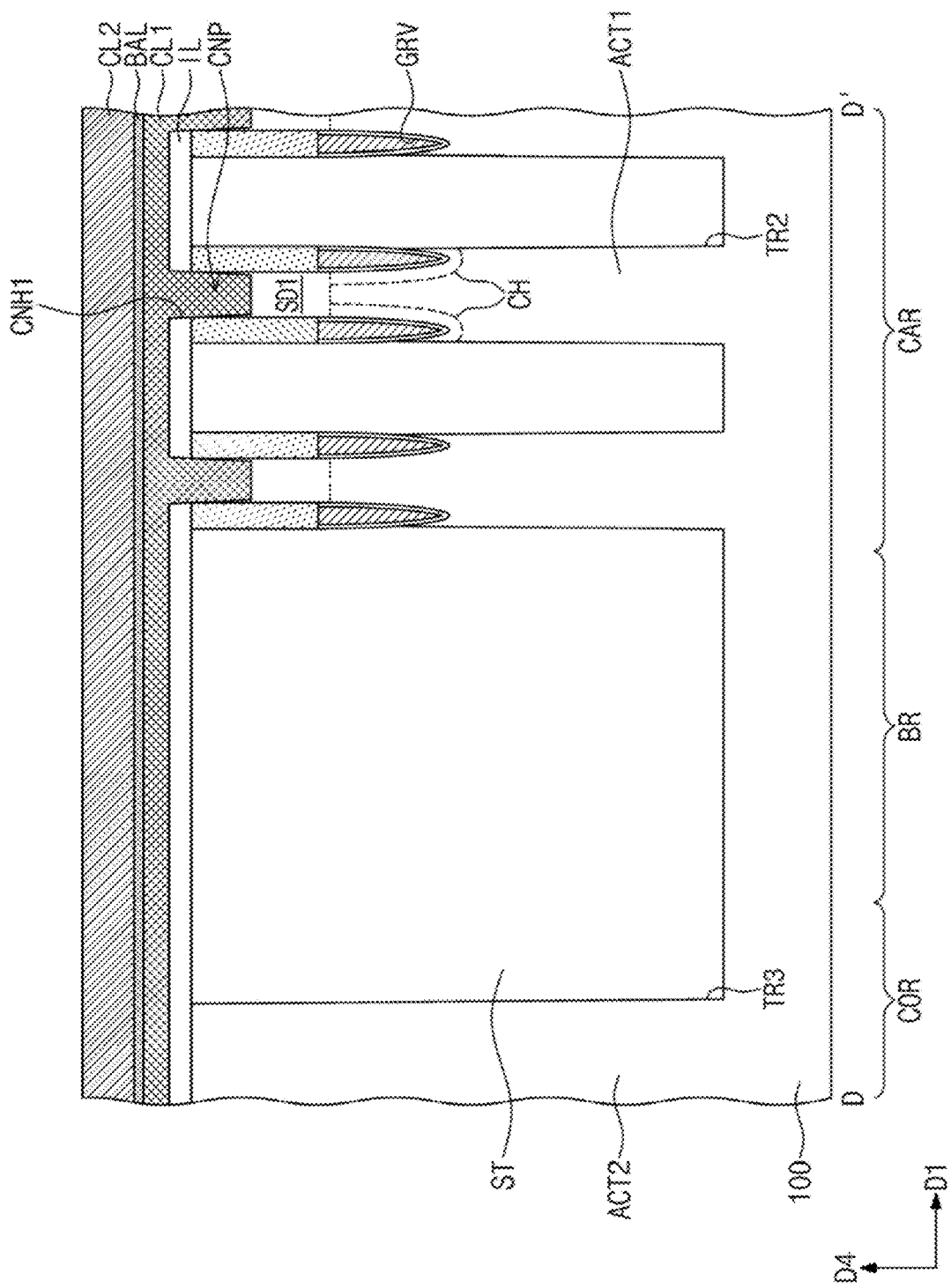
Figure 10E:
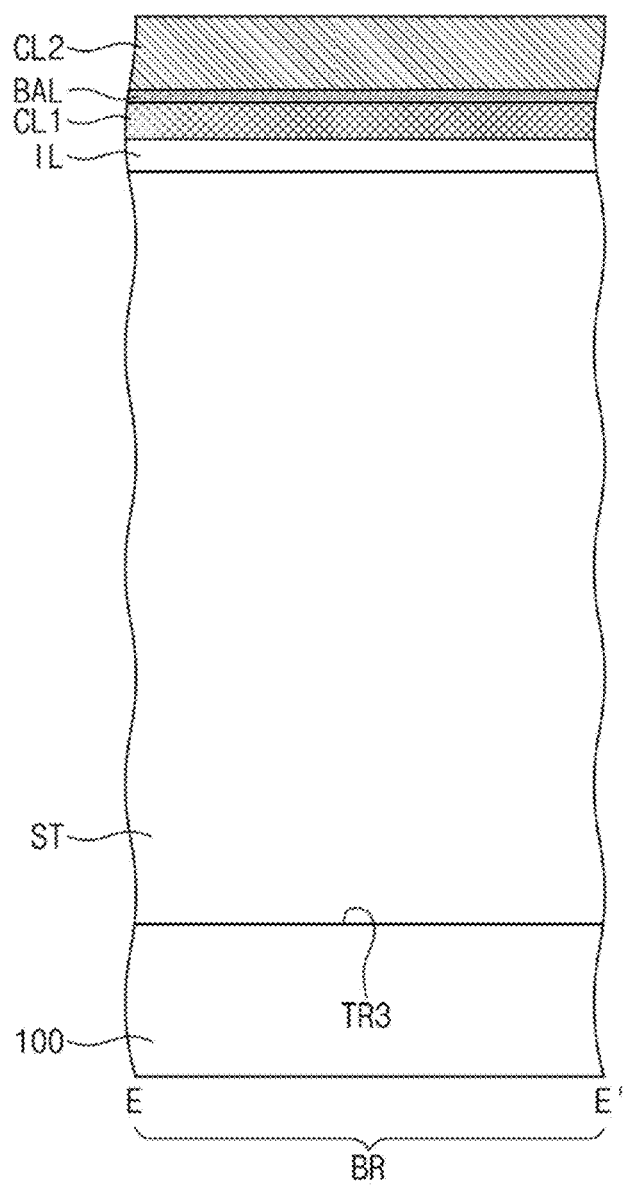
Figure 11:
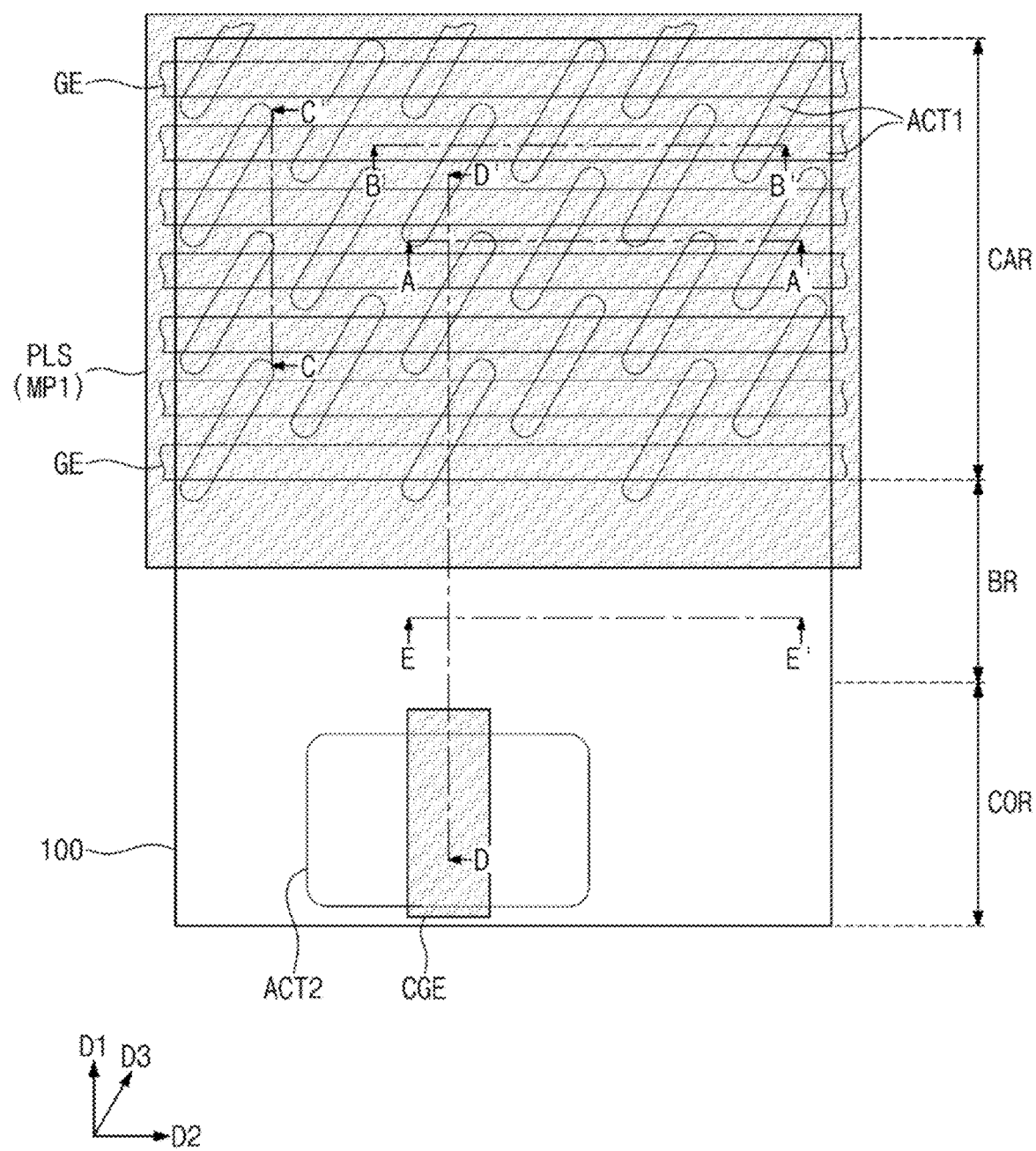

A pair of grooves GRV may be defined in each of the first active patterns ACT1 (e.g., see FIG. 3C). Each of the grooves GRV may be defined between the first and second source/drain regions SD1 and SD2. For example, as shown in at least FIG. 7, a first source/drain region SD1 and a second source/drain region SD2 of a first active pattern ACT1 may have respective, opposing sidewall surfaces SD1$i$ and SD2$i$ at least partially defining a groove GRV between the first and second source/drain regions SD1 and SD2 of the first active pattern ACT1. The groove GRV may be provided to penetrate an upper portion of the first active pattern ACT1 and may be extended from a top surface of the first active pattern ACT1 toward the bottom surface of the substrate 100 in a downward direction. A bottom of the groove GRV may be higher than the bottoms of the first and second trenches TR1 and TR2.

The upper portion of each of the first active patterns ACT1 may further include a pair of channel regions CH. When viewed in a plan view, the channel region CH may be interposed between the first and second source/drain regions SD1 and SD2. The channel region CH may be located below the groove GRV (e.g., see FIG. 3D). Thus, the channel region CH may be located at a level lower than the first and second source/drain regions SD1 and SD2.

In this description, the expression "level" may mean "vertical level measure in a vertical direction." As used herein, a vertical direction and/or the term "vertical" may refer to a direction parallel to the fourth direction D4 which may be understood to be perpendicular to the substrate 100, a top surface of the substrate 100, a bottom surface of the substrate 100, a top surface STt of the device isolation layer ST, or the like. The term "level" as expressed with regard to a component may refer to a distance and/or spacing of the component from a reference location (e.g., the substrate 100, the top surface of the substrate 100, the bottom surface of the substrate 100, a top surface STt of the device isolation layer ST, any combination thereof, or the like). The term "vertical" may be parallel to the fourth direction D4 and thus may be perpendicular to the top and/or bottom surfaces of the substrate 100. As described herein, a component escribed to be "higher" or "lower" than another element may be understood to be further or closer, respectively, in a vertical direction (e.g., the fourth direction D4) from a reference location (e.g., the substrate 100, the top surface of the substrate 100, the bottom surface of the substrate 100, a top surface STt of the device isolation layer ST, any combination thereof, or the like) than the other element.

Gate electrodes GE may be provided to cross the first active patterns ACT1 and the device isolation layer ST. The gate electrodes GE may be provided in the grooves GRV, respectively. The gate electrodes GE may be extended in the second direction D2 to be parallel to each other. A pair of the gate electrodes GE may be provided on each pair of the channel regions CH of the first active pattern ACT1. In other words, when viewed in a plan view, the gate electrode GE may be interposed between the first and second source/drain regions SD1 and SD2. A top surface of the gate electrode GE may be lower than the top surface of the first active pattern ACT1 (e.g., a top surface of the first source/drain region SD1 or a top surface of the second source/drain region SD2).

Referring back to FIG. 3D, an upper portion of the gate electrode GE may be adjacent to the first source/drain region SD1 of the first active pattern ACT1. A lower portion of the gate electrode GE may be adjacent to the channel region CH. The gate electrode GE may correspond to a word line of a memory cell.

Referring to FIGS. 2 and 3A to 3E, a gate dielectric layer GI may be interposed between the gate electrode GE and the first active pattern ACT1. A gate capping layer GP may be provided on the gate electrode GE. The gate capping layer GP may cover the top surface of the gate electrode GE. A top surface of the gate capping layer GP may be coplanar with the top surface of the first active pattern ACT1.

The gate electrode GE may be formed of or include at least one of conductive metal nitride materials (e.g., titanium nitride or tantalum nitride) and/or metallic materials (e.g., titanium, tantalum, tungsten, copper, or aluminum). The gate dielectric layer GI may be formed of or include at least one of silicon oxide, silicon nitride, silicon oxynitride, and/or high-k dielectric materials. In some example embodiments, the high-k dielectric materials may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The gate capping layer GP may include a silicon oxide layer, a silicon nitride layer, and/or a silicon oxynitride layer.

A buffer layer IL may be provided on the substrate 100. The buffer layer IL may include first contact holes CNH1, which are formed to expose the first source/drain regions SD1 of the first active patterns ACT1. In some example embodiments, the buffer layer IL may include a first insulating layer and a second insulating layer, which are sequentially stacked. The second insulating layer may have a dielectric constant higher than the first insulating layer. For example, the first insulating layer may include a silicon oxide layer, and the second insulating layer may include a silicon oxynitride layer.

Line structures LST may be provided on the buffer layer IL and may be extended in the first direction D1 and parallel to each other. The line structures LST may be arranged in the second direction D2. When viewed in a plan view, the line structures LST may be provided to cross the gate electrodes GE at a right angle (e.g., see FIG. 2). A pair of spacers SP may be provided on opposite side surfaces of each of the line structures LST. The spacers SP may be formed of or include at least one of silicon oxide, silicon nitride, and/or silicon oxynitride.

In some example embodiments, each of the spacers SP may include a first spacer, a second spacer, and a third spacer. The first spacer may directly cover a side surface of the line structure LST. The second spacer may be interposed between the first spacer and the third spacer. The second spacer may be formed of an insulating material whose dielectric constant is lower than the first and third spacers. As an example, each of the first and third spacers may include a silicon nitride layer, and the second spacer may include a silicon oxide layer. As another example, the second spacer may be an air spacer that is formed of the air.

Each of the line structures LST may include a conductive pattern CP, a barrier pattern BP, a bit line BL, and a mask pattern MP, which are sequentially stacked. The conductive pattern CP may include a contact portion CNP, which is provided to fill the first contact hole CNH1 and is coupled to the first source/drain region SD1. More specifically, the contact portion CNP may penetrate the buffer layer IL and may be extended in a direction toward the bottom surface of the substrate 100. The contact portion CNP may be in direct contact with the first source/drain region SD1.

The barrier pattern BP may prevent or suppress a metallic material in the bit line BL from being diffused into the conductive pattern CP. The bit line BL may be electrically connected to the first source/drain region SD1 through the barrier pattern BP and the conductive pattern CP.

The conductive pattern CP may be formed of or include at least one of doped semiconductor materials (e.g., doped silicon or doped germanium). The barrier pattern BP may be formed of or include at least one of conductive metal nitrides (e.g., titanium nitride or tantalum nitride). The bit line BL may be formed of or include at least one of metallic materials (e.g., titanium, tantalum, tungsten, copper, or aluminum).

The mask pattern MP may include a first mask pattern MP1, a stopper pattern STP, and a second mask pattern MP2, which are sequentially stacked on the bit line BL. The stopper pattern STP may be interposed between the first and second mask patterns MP1 and MP2. Each of the first mask pattern MP1, the stopper pattern STP, and the second mask pattern MP2 may be formed of or include silicon nitride or silicon oxynitride. As an example, the first mask pattern MP1, the stopper pattern STP, and the second mask pattern MP2 may be formed of or include the same material (e.g., silicon nitride).

Referring back to FIG. 3B, a plurality of insulating fences IFS may be provided on the gate capping layer GP. Each of the insulating fences IFS may penetrate the buffer layer IL and may be extended into an upper portion of the gate capping layer GP.

Referring back to FIGS. 2 and 3B, the insulating fences IFS may be two-dimensionally arranged in the first and second directions D1 and D2. In detail, the insulating fences IFS may be arranged in the second direction D2, on the gate capping layer GP extending in the second direction D2. The insulating fences IFS and the line structures LST may be alternately arranged in the second direction D2. The insulating fences IFS, which are arranged in the second direction D2, may be vertically overlapped with the gate electrode GE therebelow.

Referring to FIGS. 2 and 3A to 3E, contacts CNT may be provided to penetrate the buffer layer IL and to be coupled to the second source/drain regions SD2, respectively. Each of the contacts CNT may be formed to fill a second contact hole CNH2, which is formed by partially etching an upper portion of the second source/drain region SD2. Referring back to FIG. 3A, the contact CNT may be in direct contact with the second source/drain region SD2 exposed by the second contact hole CNH2. In addition, the contact CNT may be in contact with a side surface of the spacer SP and a top surface of the device isolation layer ST. The contact CNT may be spaced apart from the line structure LST adjacent thereto by the spacer SP. Each of the contacts CNT may be formed of or include at least one of doped semiconductor materials (e.g., doped silicon, doped germanium, and so forth).

Referring back to FIG. 2, the contacts CNT may be two-dimensionally arranged in the first and second directions D1 and D2. In detail, the contacts CNT and the line structures LST may be alternately arranged in the second direction D2. The contacts CNT and the insulating fences IFS may be interposed between adjacent ones of the line structures LST. The contacts CNT and the insulating fences IFS between the adjacent ones of the line structures LST may be alternately arranged in the first direction D1.

Landing pads LP may be provided on and coupled to the contacts CNT, respectively. The landing pads LP may be electrically connected to the second source/drain regions SD2, respectively, through the contacts CNT. The landing pad LP may be misaligned from the contact CNT connected thereto. That is, a center of the landing pad LP may be horizontally offset from a center of the contact CNT connected thereto (e.g., see FIGS. 2 and 3A). The landing pads LP may be formed of or include at least one of metallic materials (e.g., titanium, tantalum, tungsten, copper, or aluminum).

An insulating pattern INP may be provided on the mask patterns MP. The insulating pattern INP on the cell region CAR may define a planar shape of the landing pad LP. The landing pads LP, which are adjacent to each other, may be separated from each other by the insulating pattern INP.

Data storing elements DS may be provided on the landing pads LP, respectively. In detail, each of the data storing elements DS may be electrically connected to the second source/drain region SD2 through the landing pad LP and the contact CNT. In some example embodiments, each of the data storing elements DS may be a capacitor that is used to store data. As an example, the data storing elements DS may include bottom electrodes respectively connected to the landing pads LP, a top electrode covering the bottom electrodes, and a dielectric layer interposed between the bottom electrodes and the top electrode. The top electrode may be a common electrode that is provided to cover all or some of the bottom electrodes.

Each of the bottom electrodes may be shaped like a hollow cylinder. Each of the bottom electrodes may be formed of or include at least one of doped silicon, metallic materials (e.g., tungsten), or conductive metal compounds (e.g., titanium nitride). The dielectric layer may be formed of or include at least one of high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof). The top electrode may be formed of or include at least one of doped silicon, Ru, RuO, Pt, PtO, Ir, IrO, SrRuO(SRO), (Ba,Sr)RuO(BSRO), CaRuO (CRO), BaRuO, La(Sr,Co)O, Ti, TiN, W, WN, Ta, TaN, TiAlN, TiSiN, TaAlN, TaSiN, or combinations thereof.

Hereinafter, the boundary region BR and the core region COR will be described in more detail with reference to FIGS. 2, 3D, and 3E. A third trench TR3 may be defined between the cell region CAR and the core region COR of the substrate 100. In other words, the third trench TR3 may be defined on the boundary region BR of the substrate 100. The device isolation layer ST may be provided to fill the third trench TR3.

At least one second active pattern ACT2 may be provided on the core region COR. In some example embodiments, the third trench TR3 may be defined between the first active pattern ACT1 of the cell region CAR and the second active pattern ACT2 of the core region COR. For example, as shown in at least FIG. 3D, the first active pattern ACT1 of the cell region CAR and the second active pattern ACT2 of the core region COR have respective, opposing sidewall surfaces ACT1s and ACT2s at least partially defining the third trench TR3 between the first active pattern ACT1 of the cell region CAR and the second active pattern ACT2 of the core region COR, and the device isolation layer ST may fill the third trench TR3. In FIG. 2, the second active pattern ACT2 is illustrated to have a rectangular shape, but the inventive concepts are not limited to this example; for example, the shape of the second active pattern ACT2 may be variously changed.

A core gate structure CGS may be provided on the core region COR. The core gate structure CGS may include a core gate insulating layer CGI, the conductive pattern CP, the barrier pattern BP, a core gate electrode CGE, and the first mask pattern MP1, which are sequentially stacked on the second active pattern ACT2. In some example embodiments, the core gate structure CGS and the second active pattern ACT2 may constitute a transistor of the sense amplifier in the core region COR.

The elements constituting the core gate structure CGS may be formed by substantially the same process as the elements constituting the line structure LST on the cell region CAR described above. Each of the elements of the core gate structure CGS may be disposed at the same level as a corresponding one of the elements of the line structure LST. For example, the core gate insulating layer CGI may correspond to the buffer layer IL, and the core gate electrode CGE may correspond to the bit line BL.

In some example embodiments, an end of the core gate structure CGS may be extended to a region on the device isolation layer ST of the boundary region BR. In other words, at least a portion of the core gate structure CGS may be vertically overlapped with the device isolation layer ST of the boundary region BR.

A sidewall spacer SPC may be provided on a side surface of the core gate structure CGS. As shown in FIG. 3D, the sidewall spacer SPC may be placed on the device isolation layer ST of the boundary region BR. The sidewall spacer SPC may be formed of or include at least one of silicon oxide, silicon nitride, or silicon oxynitride.

Referring to FIG. 2, an end EN of the line structure LST may be extended to a region on the device isolation layer ST of the boundary region BR. A capping pattern DML may be connected to the end EN of the line structure LST. The capping pattern DML may be provided on the device isolation layer ST of the boundary region BR. The capping pattern DML may be extended from the end EN of the line structure LST toward the core region COR in an opposite direction of the first direction D1. The capping pattern DML and the line structure LST, which are connected to each other, may be aligned to each other in the first direction D1. A linewidth of the capping pattern DML may be substantially equal to a linewidth of the line structure LST connected thereto.

Referring back to FIGS. 2, 3D, and 3E, the capping pattern DML may include the stopper pattern STP and the second mask pattern MP2. The conductive pattern CP, the barrier pattern BP, and the bit line BL may be omitted from the capping pattern DML.

The stopper pattern STP may cover the end EN of the line structure LST on the boundary region BR. The stopper pattern STP may be extended from the cell region CAR to cover the top surface of the device isolation layer ST on the boundary region BR as well as the core gate structure CGS on the core region COR. The stopper pattern STP may cover the sidewall spacer SPC. An interlayer insulating layer ILD may be interposed between the capping pattern DML and the stopper pattern STP covering the sidewall spacer SPC.

The second mask pattern MP2 may be provided on the stopper pattern STP. The second mask pattern MP2 may be extended from the cell region CAR to a region on the core gate structure CGS through the boundary region BR, and a portion of the second mask pattern MP2 on the boundary region BR may be used as a part of the capping pattern DML. When viewed in a plan view, the second mask pattern MP2 may be overlapped with the capping pattern DML. The second mask pattern MP2 may be a plate-shaped pattern that is overlapped with the core region COR. For example, the second mask pattern MP2 on the core region COR may cover not only the core gate structure CGS but also the interlayer insulating layer ILD around the core gate structure CGS.

In some example embodiments, as shown in FIG. 2, the second mask pattern MP2 may have a hand shape, when viewed in a plan view. In detail, the second mask pattern MP2 on the cell and boundary regions CAR and BR may be a line-shaped pattern, which is extended in the first direction D1. The second mask pattern MP2 on the cell and boundary regions CAR and BR may be used as a part of the line structure LST and a part of the capping pattern DML. The second mask pattern MP2 on the core region COR may be a plate-shaped pattern that is formed to fully cover the core region COR.

A recess region RS may be defined in an upper portion of the device isolation layer ST below the capping pattern DML. For example, as shown in at least FIG. 3D, the device isolation layer ST may include one or more inner surfaces STi at least partially defining a recess region RS which is adjacent to the end SN of the line structure LST. A bottom of the recess region RS in the device isolation layer ST may be lower than a top surface STt of the device isolation layer ST below the line structure LST. The bottom of the recess region RS in the device isolation layer ST may be lower than the top surface of the device isolation layer ST below the core gate structure CGS.

The second mask pattern MP2 of the capping pattern DML may be extended into the recess region RS of the device isolation layer ST along the stopper pattern STP. A bottom surface of the second mask pattern MP2 of the capping pattern DML may be lower than a bottom surface of the second mask pattern MP2 of the line structure LST. The bottom surface of the second mask pattern MP2 of the capping pattern DML may be lower than a bottom surface of the second mask pattern MP2 on the core region COR.

A bottom surface DMLb of the capping pattern DML may be in contact with a bottom of the recess region RS of the device isolation layer ST. The bottom surface DMLb of the capping pattern DML may be lower than a bottom surface of the buffer layer IL of the line structure LST. In other words, the bottom surface DMLb of the capping pattern DML may be lower than the top surface STt of the device isolation layer ST below the line structure LST. For example, as shown in at least FIG. 3D, the top surface STt of the device isolation layer ST may be between the line structure LST and the bottom surface DMLb of the capping pattern DML in the fourth direction D4 (e.g., a vertical direction).

Referring back to FIG. 3E, a pair of spacers SP may be provided on opposite side surfaces of the capping pattern DML. The pair of spacers SP may be extended from the opposite side surfaces of the line structure LST to the opposite side surfaces of the capping pattern DML. A dummy contact DCNT may be provided between adjacent ones of the capping patterns DML. A bottom of the dummy contact DCNT may be in contact with the device isolation layer ST. A dummy conductive layer DCL may be provided on the dummy contact DCNT.

Referring back to FIGS. 2, 3D, and 3E, the insulating pattern INP may be provided on the second mask pattern MP2. Although not shown, at least one metal line may be provided in the insulating pattern INP. The metal line may be provided to electrically connect the bit line BL of the line structure LST to the core gate electrode CGE of the core gate structure CGS.

The capping pattern DML according to some example embodiments of the inventive concepts will be described in more detail with reference to FIG. 4. The capping pattern DML may be provided between the interlayer insulating layer ILD of the core region COR and the end EN of the line structure LST. The capping pattern DML may be provided to encapsulate the end EN of the line structure LST. In other words, the capping pattern DML may prevent the bit line BL from being exposed to an oxygen environment, near the end EN of the line structure LST.

The capping pattern DML may be extended toward the device isolation layer ST along the end EN of the line structure LST. A lower portion of the capping pattern DML may be provided in the recess region RS of the device isolation layer ST. The bottom surface DMLb of the capping pattern DML may be lower than a bottom surface of the line structure LST. The bottom surface DMLb of the capping pattern DML may be lower than the top surface STt of the device isolation layer ST below the line structure LST. Accordingly, the capping pattern DML may be provided to fully encapsulate the end EN of the line structure LST.

The sidewall spacer SPC may be provided on the side surface of the core gate structure CGS, but the spacer may not be provided on the end EN of the line structure LST. The capping pattern SML may comprise a material different from a material of the sidewall spacer SPC. The end EN of the line structure LST may be directly covered with the capping pattern DML. In detail, the end EN of the line structure LST may be directly covered with the stopper pattern STP of the capping pattern DML. For example, the end EN of the line structure LST may be directly covered with (e.g., in direct contact with) the capping pattern DML without the sidewall spacer SPC being interposed between the end EN of the line structure LST and the capping pattern DML. In some example embodiments, since the stopper pattern STP includes silicon nitride, an end EN of the bit line BL may be prevented from being exposed to the oxygen environment.

The recess region RS of the device isolation layer ST may include an undercut region UCR, which is extended to a region below the line structure LST. The undercut region UCR may be an empty space, which is horizontally extended from the recess region RS. The undercut region UCR may be formed to expose at least a portion of a bottom surface ILb of the buffer layer IL. The capping pattern DML may include a lower protruding portion LPP filling the undercut region UCR. A top surface of the lower protruding portion LPP may directly cover the bottom surface ILb of the buffer layer IL. The lower protruding portion LPP may be vertically overlapped with at least a portion of the line structure LST.

As shown in FIG. 4, the capping pattern DML according to some example embodiments may have the shape of the letter and may cover the end EN of the line structure LST. Accordingly, the capping pattern DML may encapsulate the end EN of the line structure LST more effectively, and thus, the end EN of the bit line BL may be more effectively prevented from being exposed to the oxygen environment.

Figure 5:
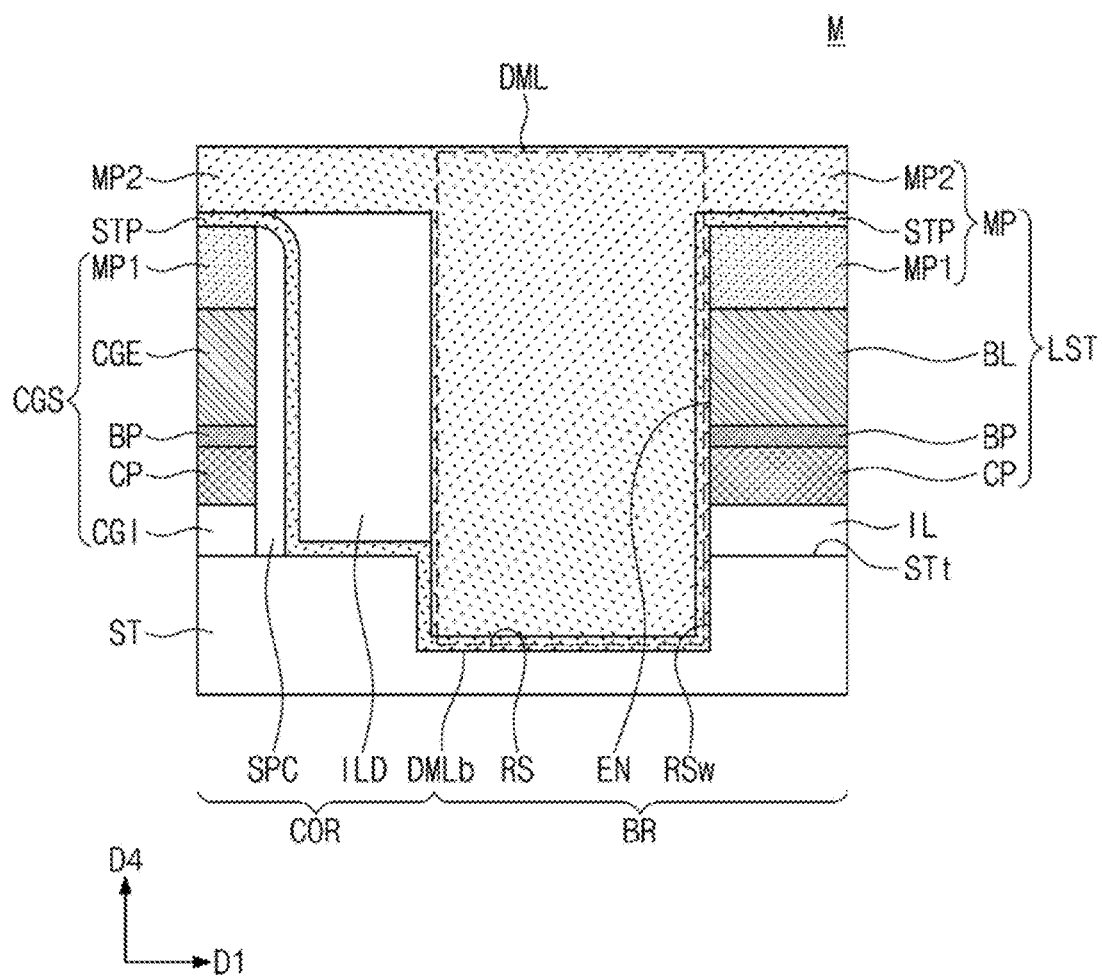
FIGS. 5 and 6 are enlarged sectional views, each of which illustrates a portion (e.g., M of FIG. 3D) of a semiconductor device according to some example embodiments of the inventive concepts.
Figure 6:
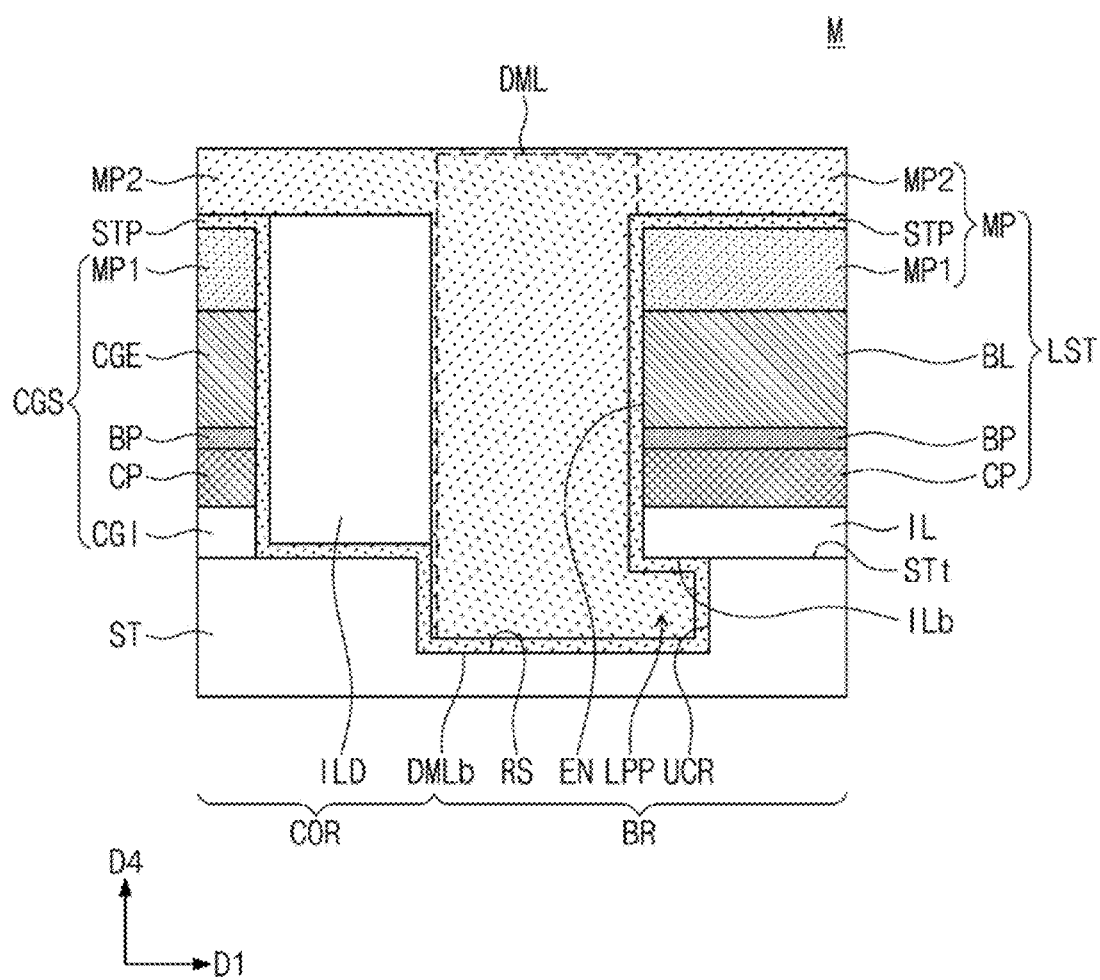

FIGS. 5 and 6 are enlarged sectional views, each of which illustrates a portion (e.g., M of FIG. 3D) of a semiconductor device according to some example embodiments of the inventive concepts. In the following description of some example embodiments, an element previously described with reference to FIG. 4 may not be described in much further detail for the sake of brevity.

Referring to FIG. 5, the recess region RS of the device isolation layer ST may include an inner sidewall RSw that is adjacent to the end EN of the line structure LST. The inner sidewall RSw of the recess region RS may be vertically aligned to the end EN of the line structure LST. The capping pattern DML may directly cover the end EN of the line structure LST and the inner sidewall RSw of the recess region RS.

The recess region RS of the device isolation layer ST in some example embodiments may not have the undercut region UCR, unlike some example embodiments, including the example embodiments previously described with reference to FIG. 4. In some example embodiments, the lower protruding portion LPP may be omitted from the capping pattern DML.

Referring to FIG. 6, the sidewall spacer SPC on the side surface of the core gate structure CGS may be omitted. The stopper pattern STP may directly cover the side surface of the core gate structure CGS. The interlayer insulating layer ILD may be provided between the stopper pattern STP and the capping pattern DML.

FIGS. 7, 9, 11, 13, and 15 are plan views illustrating a method of fabricating a semiconductor device according to some example embodiments of the inventive concepts. FIGS. 8A, 10A, 12A, 14A, and 16A are sectional views taken along lines A-A' of FIGS. 7, 9, 11, 13, and 15, respectively. FIGS. 8B, 10B, 12B, 14B, and 16B are sectional views taken along lines B-B' of FIGS. 7, 9, 11, 13, and 15, respectively. FIGS. 8C, 10C, 12C, 14C, and 16C are sectional views taken along lines C-C' of FIGS. 7, 9, 11, 13, and 15, respectively. FIGS. 8D, 10D, 12D, 14D, and 16D are sectional views taken along lines D-D' of FIGS. 7, 9, 11, 13, and 15, respectively. FIGS. 8E, 10E, 12E, 14E, and 16E are sectional views taken along lines E-E' of FIGS. 7, 9, 11, 13, and 15, respectively. FIGS. 17, 18, 19, 20, and 21 are sectional views illustrating a method of forming a portion 'N' of FIG. 14D.

Referring to FIGS. 7 and 8A to 8E, the substrate 100 including the cell region CAR, the boundary region BR, and the core region COR may be provided. An upper portion of the substrate 100 may be patterned to form the first active patterns ACT1 on the cell region CAR and the second active pattern ACT2 on the core region COR.

Each of the first active patterns ACT1 may be extended in the third direction D3 that is parallel to the top surface of the substrate 100. The first active patterns ACT1 may be two-dimensionally arranged in the first and second directions D1 and D2. The first active patterns ACT1 may be spaced apart from each other in the third direction D3.

The first and second trenches TR1 and TR2 may be formed between the first active patterns ACT1. The first trench TR1 may be formed between a pair of the first active patterns ACT1, which are adjacent to each other in the second direction D2. The second trench TR2 may be formed between a pair of the first active patterns ACT1, which are adjacent to each other in the third direction D3.

The third trench TR3 may be formed between the first active pattern ACT1 of the cell region CAR and the second active pattern ACT2 of the core region COR. The third trench TR3 may be formed on the boundary region BR and the core region COR.

The device isolation layer ST may be formed to fill (e.g., partially or fully fill the defined volume space of) the first to third trenches TR1 to TR3. In some example embodiments, the device isolation layer ST may be formed to fully fill the first to third trenches TR1 to TR3 and to cover the first and second active patterns ACT1 and ACT2. A planarization process may be performed on the device isolation layer ST to expose the top surfaces of the first and second active patterns ACT1 and ACT2.

The grooves GRV may be formed by patterning the first active patterns ACT1 and the device isolation layer ST on the cell region CAR. When viewed in a plan view, each of the grooves GRV may be a line-shaped empty region that is extended in the second direction D2.

The formation of the grooves GRV may include forming a hard mask pattern including openings and etching exposed portions of the first active patterns ACT1 and the device isolation layer ST using the hard mask pattern as an etch mask. The groove GRV may be formed to be shallower than the first trench TR1.

The gate dielectric layer GI, the gate electrode GE, and the gate capping layer GP may be sequentially formed in each of the grooves GRV. In detail, the gate dielectric layer GI may be formed to conformally cover an inner surface of the groove GRV. The gate dielectric layer GI may include a silicon oxide layer, a silicon nitride layer, a silicon oxynitride layer, and/or a high-k dielectric layer.

The gate electrode GE may be formed by forming a conductive layer on the gate dielectric layer GI to fill the groove GRV. The conductive layer may be formed of or include at least one of conductive metal nitride materials and/or metallic materials.

The gate dielectric layer GI and the gate electrode GE may be recessed, and then, the gate capping layer GP may be formed in the recessed portion of the gate electrode GE. The gate capping layer GP may have a top surface that is coplanar with the top surface of the first active pattern ACT1.

The first source/drain region SD1 and a pair of the second source/drain regions SD2 may be formed in an upper portion of the first active pattern ACT1 by performing an ion implantation process on the first active patterns ACT1. The pair of the second source/drain regions SD2 may be spaced apart from each other in the third direction D3 with the first source/drain region SD1 interposed therebetween. In some example embodiments, the first and second source/drain regions SD1 and SD2 may be doped with the same impurity.

The channel region CH may be defined in a portion of the first active pattern ACT1 located below the gate electrode GE. When viewed in a plan view, the channel region CH may be interposed between the first and second source/drain regions SD1 and SD2. The gate electrode GE may be provided to face a top surface and opposite side surfaces of the channel region CH (e.g., see FIG. 8B).

Referring to FIGS. 9 and 10A to 10E, the buffer layer IL may be formed on the top surface of the substrate 100. In other words, the buffer layer IL may be formed on the cell region CAR, the boundary region BR, and the core region COR. As an example, the buffer layer IL may be a multi-layered structure, in which a silicon oxide layer and a silicon oxynitride layer are stacked. The buffer layer IL on the cell region CAR may be patterned to form the first contact holes CNH1 exposing the first source/drain regions SD1 of the first active patterns ACT1, respectively. When the first contact hole CNH1 is formed, an upper portion of the first source/drain region SD1 may be recessed. When the first contact hole CNH1 is formed, an upper portion of the device isolation layer ST around the first source/drain region SD1 may also be recessed.

A first conductive layer CL1, a barrier layer BAL, and a second conductive layer CL2 may be sequentially formed on the buffer layer IL. The first conductive layer CL1, the barrier layer BAL, and the second conductive layer CL2 may be formed on the cell region CAR, the boundary region BR, and the core region COR.

The first conductive layer CL1 may fill the first contact holes CNH1. In other words, the first conductive layer CL1 may be in contact with the first source/drain regions SD1 of the first active patterns ACT1. The first conductive layer CL1 filling the first contact hole CNH1 may be used as the contact portion CNP. The first conductive layer CL1 may be vertically spaced apart from the second source/drain regions SD2 of the first active patterns ACT1 by the buffer layer IL. The first conductive layer CL1 may be formed of or include a doped semiconductor material.

The barrier layer BAL may be formed to be interposed between the first conductive layer CL1 and the second conductive layer CL2. The barrier layer BAL may be formed of or include at least one of conductive metal nitride materials. The second conductive layer CL2 may be formed of or include at least one of metallic materials. The barrier layer BAL may prevent or suppress a metallic material in the second conductive layer CL2 from being diffused into the first conductive layer CL1.

Referring to FIGS. 11 and 12A to 12E, the first mask pattern MP1 may be formed on the second conductive layer CL2. The first mask pattern MP1 may be formed to fully cover the cell region CAR. An edge of the first mask pattern MP1 may be overlapped with the boundary region BR. The first mask pattern MP1 on the core region COR may define the core gate structure CGS. In detail, the formation of the first mask pattern MP1 may include forming a first mask layer on the second conductive layer CL2 and patterning the first mask layer using a photolithography process.

The second conductive layer CL2, the barrier layer BAL, the first conductive layer CL1, and the buffer layer IL may be etched using the first mask pattern MP1 thereon as an etch mask. Accordingly, a portion of the device isolation layer ST, which is not covered with the first mask pattern MP1, may be exposed (e.g., see FIGS. 12D and 12E).

A plate structure PLS may be formed by patterning the buffer layer IL, the first conductive layer CL1, the barrier layer BAL, and the second conductive layer CL2 on the cell region CAR using the first mask pattern MP1. When viewed in a plan view, the plate structure PLS may have a rectangular plate shape. The plate structure PLS may be fully overlapped with the cell region CAR. An edge of the plate structure PLS may be overlapped with at least a portion of the boundary region BR.

The core gate structure CGS may be formed by patterning the buffer layer IL, the first conductive layer CL1, the barrier layer BAL, and the second conductive layer CL2 on the second active pattern ACT2 using the first mask pattern MP1. The core gate structure CGS may include the core gate insulating layer CGI, the conductive pattern CP, the barrier pattern BP, the core gate electrode CGE, and the first mask pattern MP1, which are sequentially stacked on the second active pattern ACT2.

The sidewall spacer SPC may be formed on the end EN (or the side surface) of the plate structure PLS, which is located on the boundary region BR. The sidewall spacer SPC may also be formed on the side surface of the core gate structure CGS. The formation of the sidewall spacer SPC may include forming a spacer layer on the substrate 100 and anisotropically etching the spacer layer. The sidewall spacer SPC may be formed of or include silicon oxide.

Referring to FIGS. 13 and 14A to 14E, the line structures LST, which are extended in the first direction D1 and parallel to each other, may be formed by patterning the plate structure PLS on the cell region CAR. The line structures LST may be extended from the cell region CAR to the boundary region BR. The capping pattern DML may be formed on the end EN of the line structure LST, which is located on the boundary region BR.

In detail, the formation of the line structure LST and the capping pattern DML may include forming a stopper layer and a second mask layer on the substrate 100, forming the second mask pattern MP2 from the second mask layer using a photolithography process, and patterning the plate structure PLS using the second mask pattern MP2 as an etch mask.

The stopper pattern STP, the first mask pattern MP1, the bit line BL, the barrier pattern BP, and the conductive pattern CP may be formed by sequentially patterning the stopper layer, the first mask pattern MP1, the second conductive layer CL2, the barrier layer BAL, and the first conductive layer CL1, respectively, using the second mask pattern MP2 on the cell region CAR as an etch mask. The conductive pattern CP, the barrier pattern BP, the bit line BL, and the mask pattern MP, which are sequentially stacked on the buffer layer IL of the cell region CAR, may form the line structure LST. In other words, the second mask pattern MP2 on the cell region CAR may be used to form a plurality of the line structures LST from the plate structure PLS. When viewed in a plan view, each of the bit lines BL may be extended to cross the gate electrodes GE.

The conductive pattern CP of the line structure LST may include the contact portions CNP filling the first contact holes CNH1, respectively. The conductive pattern CP may be connected to the first source/drain region SD1 through the contact portion CNP. In other words, the bit line BL may be electrically connected to the first source/drain region SD1 through the conductive pattern CP.

The second mask pattern MP2 on the boundary region BR may be used as a part of the capping pattern DML. The capping pattern DML may cover the end EN of the line structure LST. The capping pattern DML may prevent the bit line BL from being exposed to the oxygen environment during the patterning process for forming the bit line BL.

The second mask pattern MP2 on the core region COR may have a plate shape and may be fully overlapped with the core region COR. That is, the second mask pattern MP2 may cover a top surface of the core gate structure CGS.

Figure 14A:
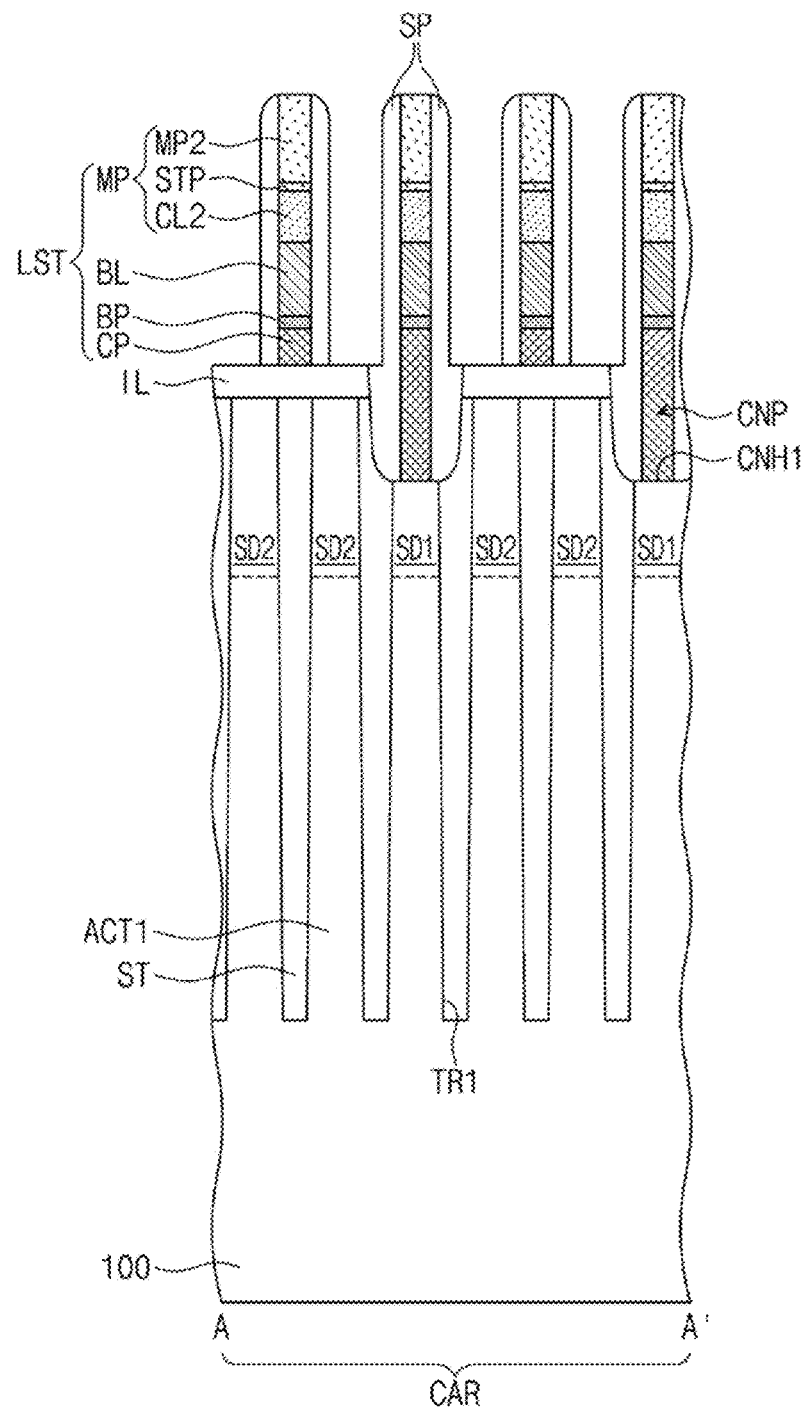
Figure 14B:
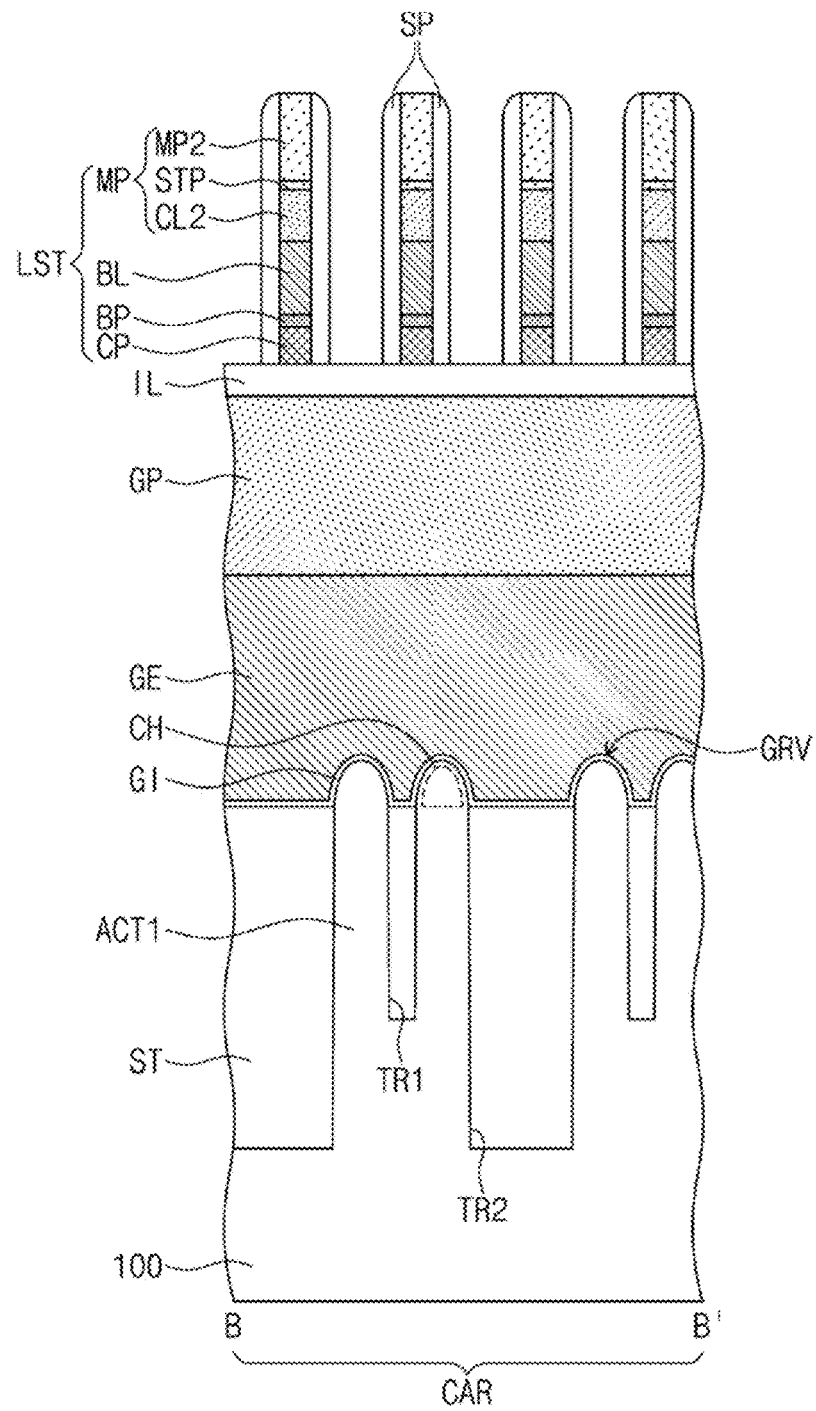
Figure 14B:
Figure 14C:
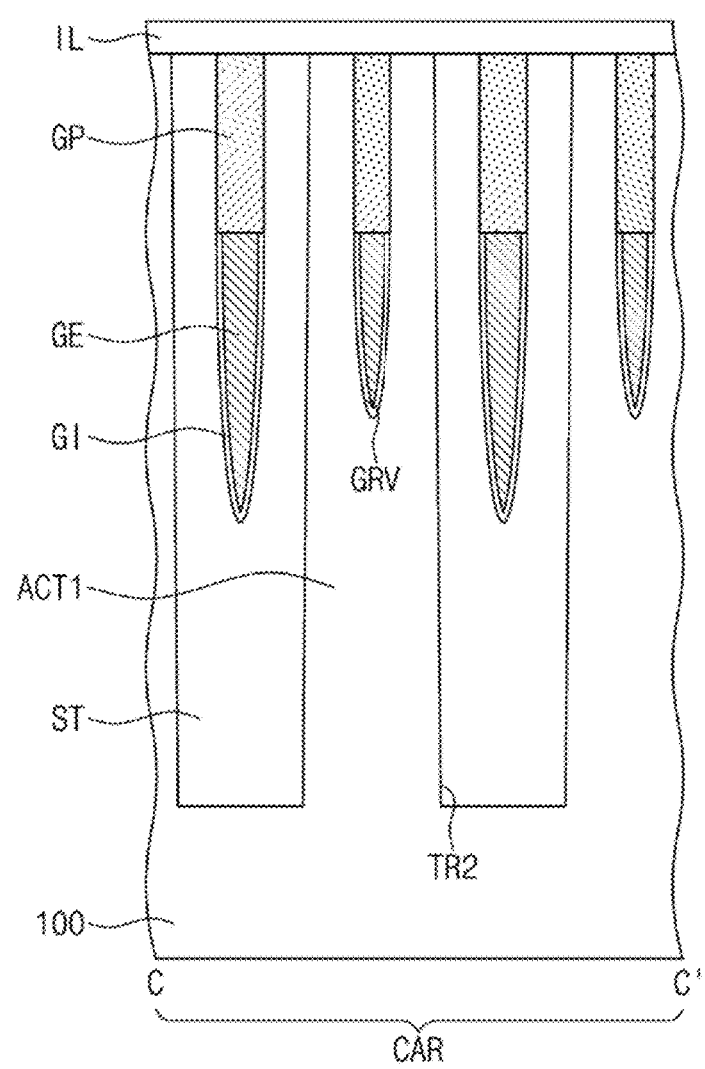
Figure 14D:
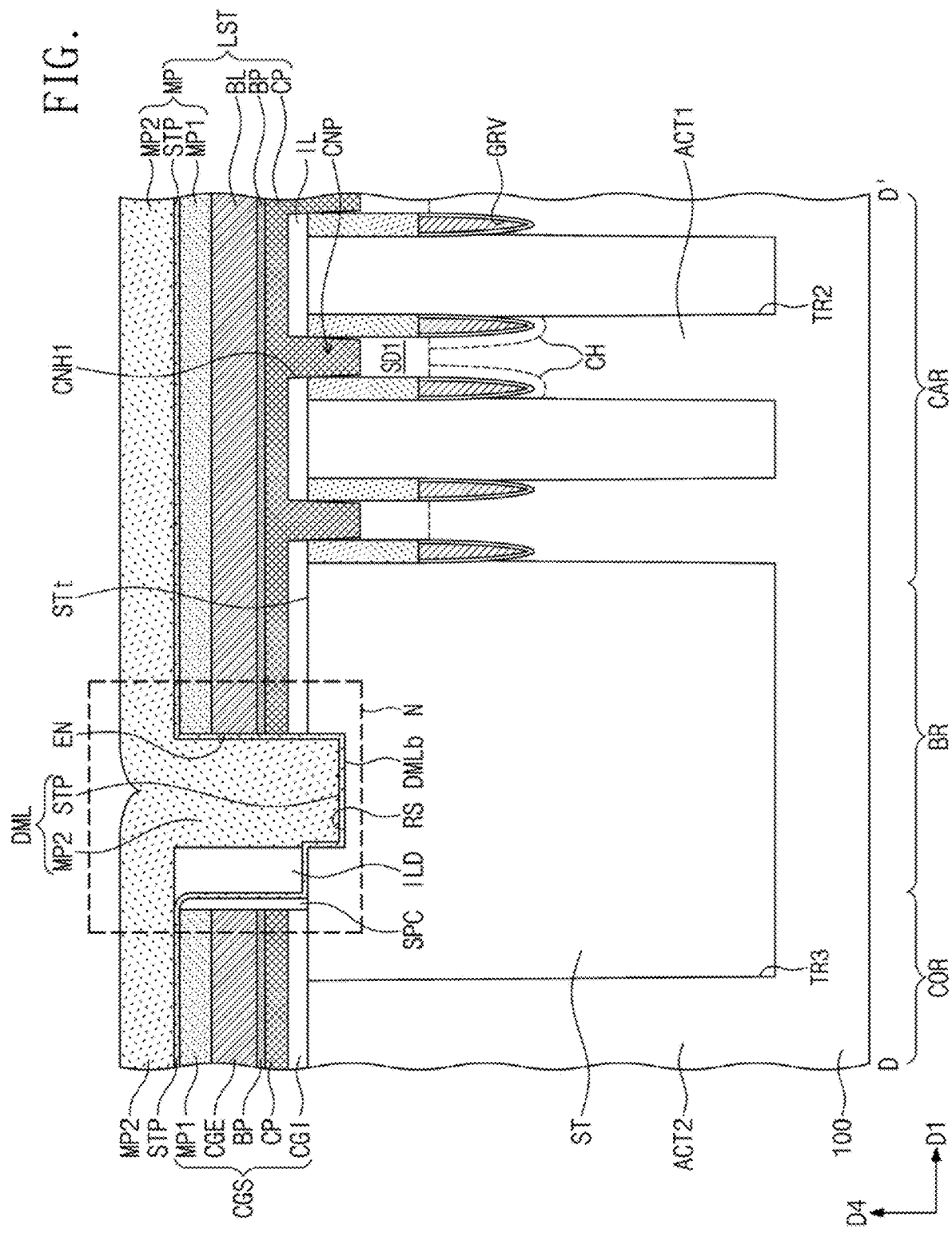
Figure 14E:
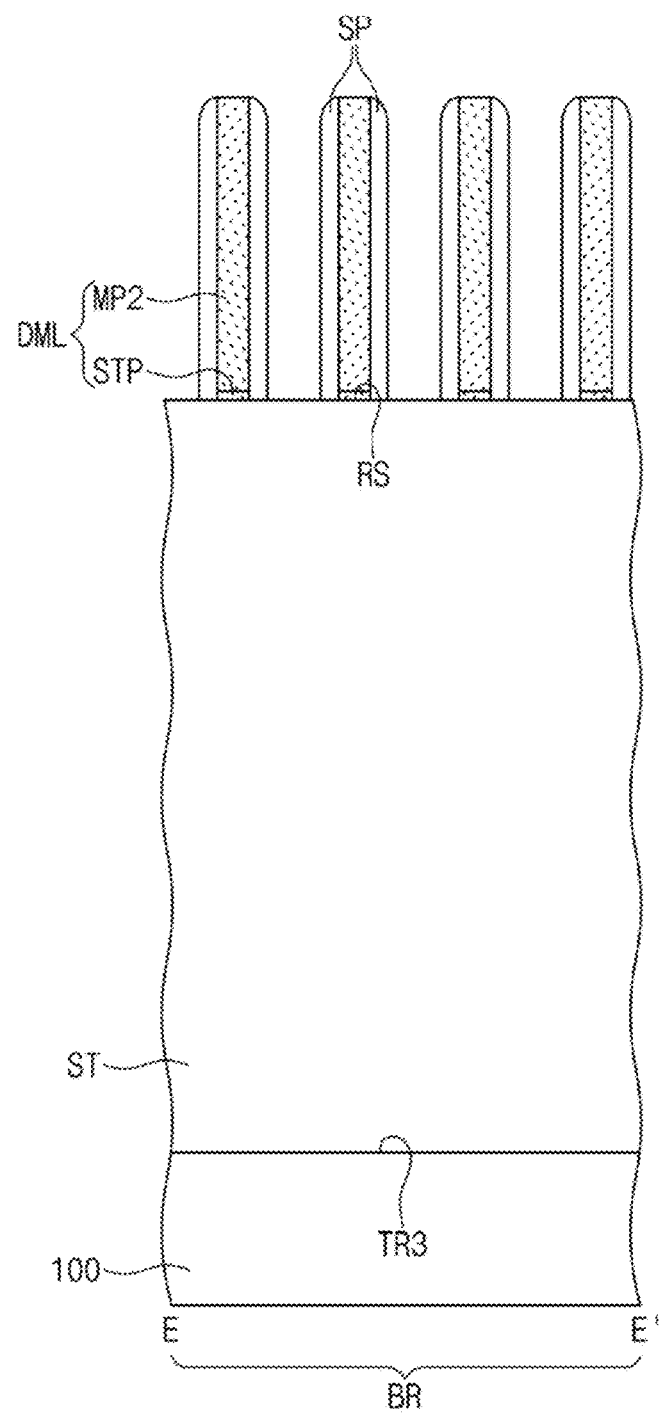
Figure 15:
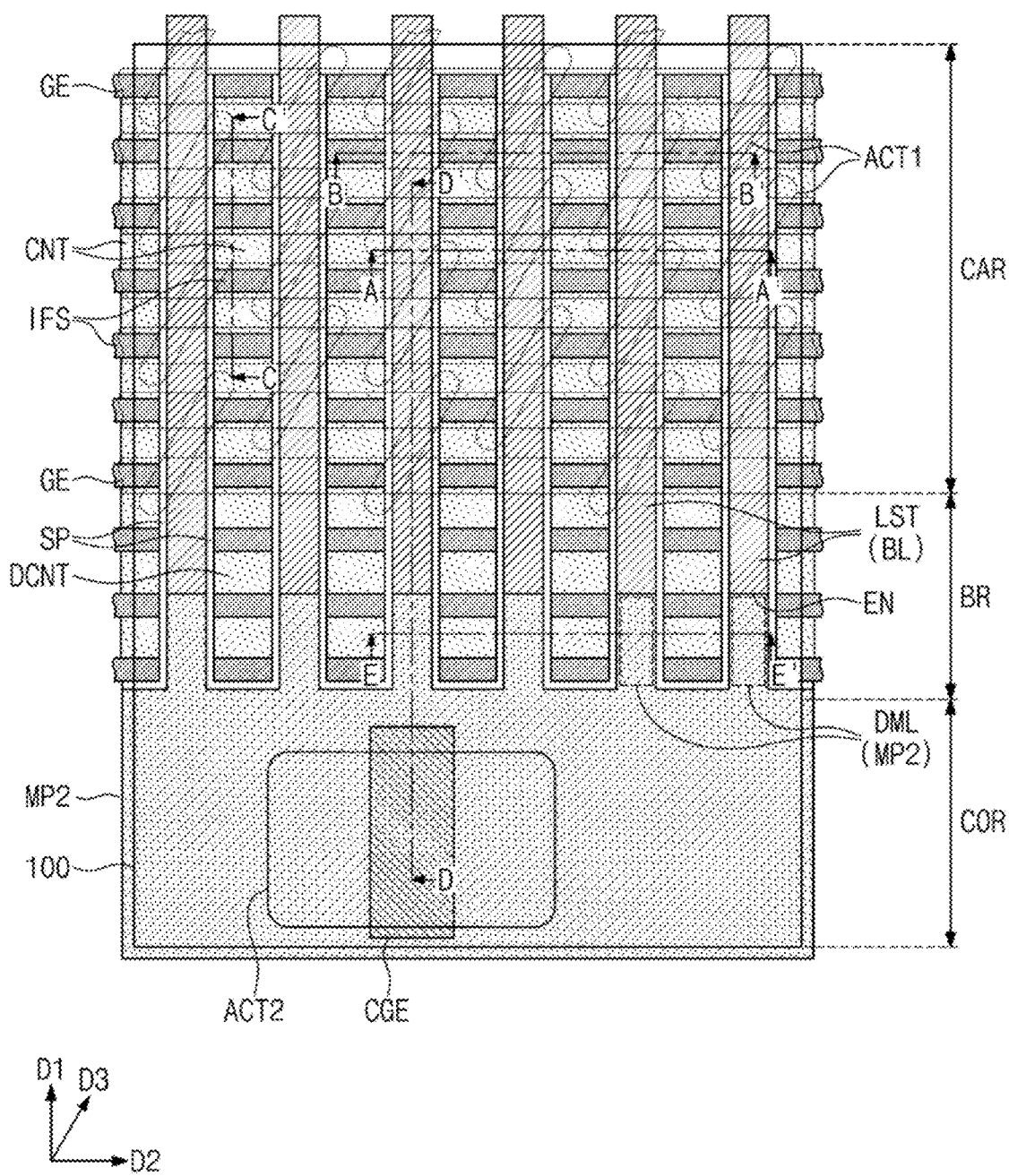
Figure 16A:
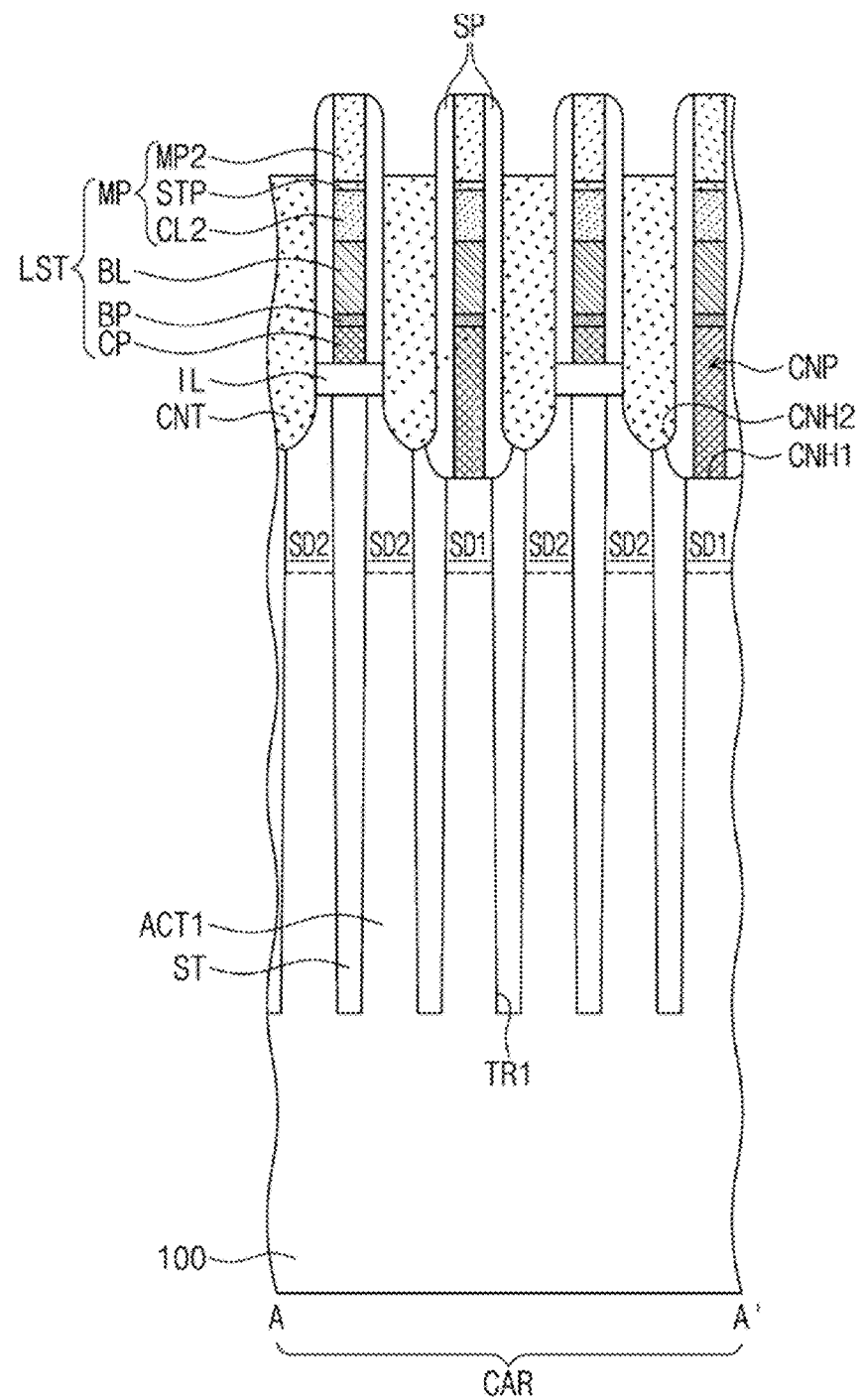
Figure 16B:
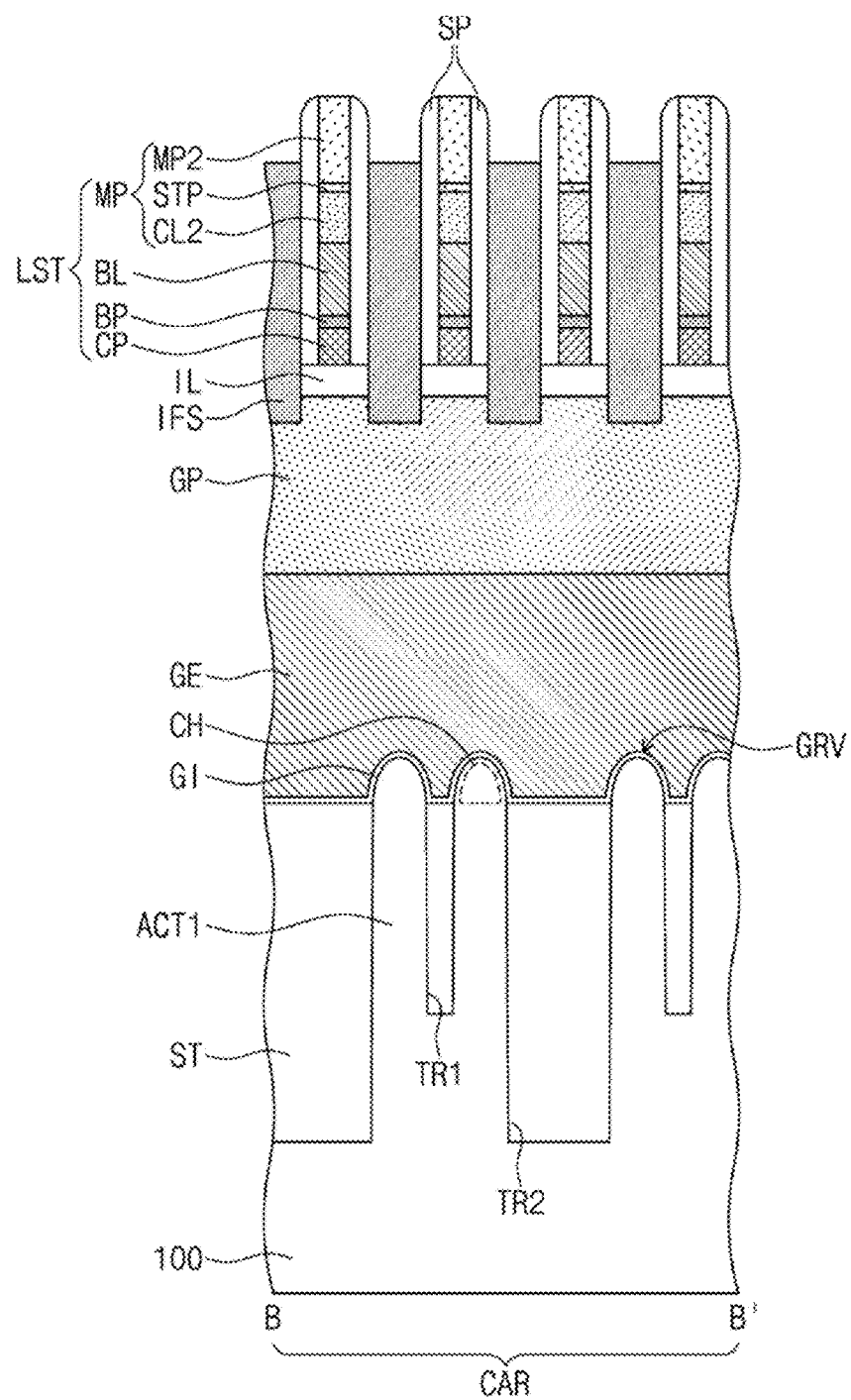
Figure 16C:
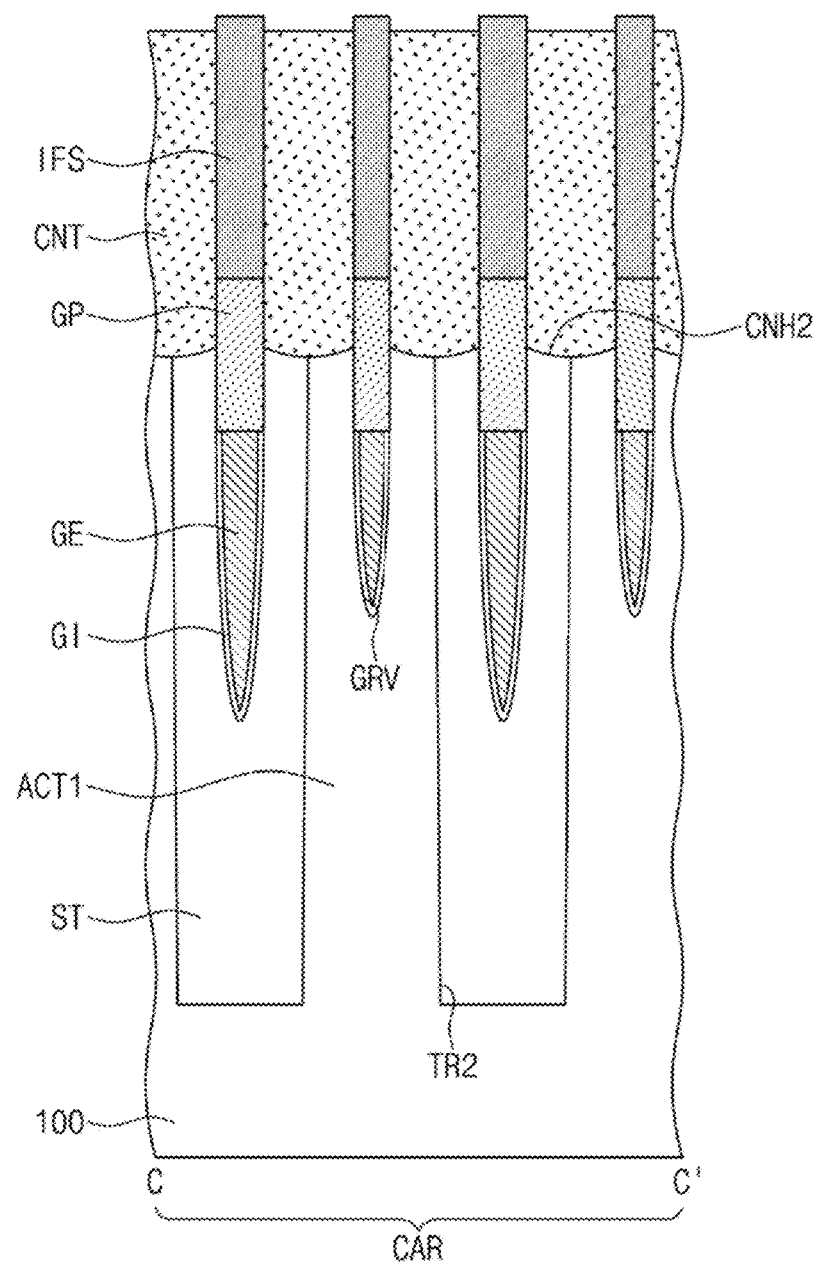
Figure 16C:
Figure 16D:
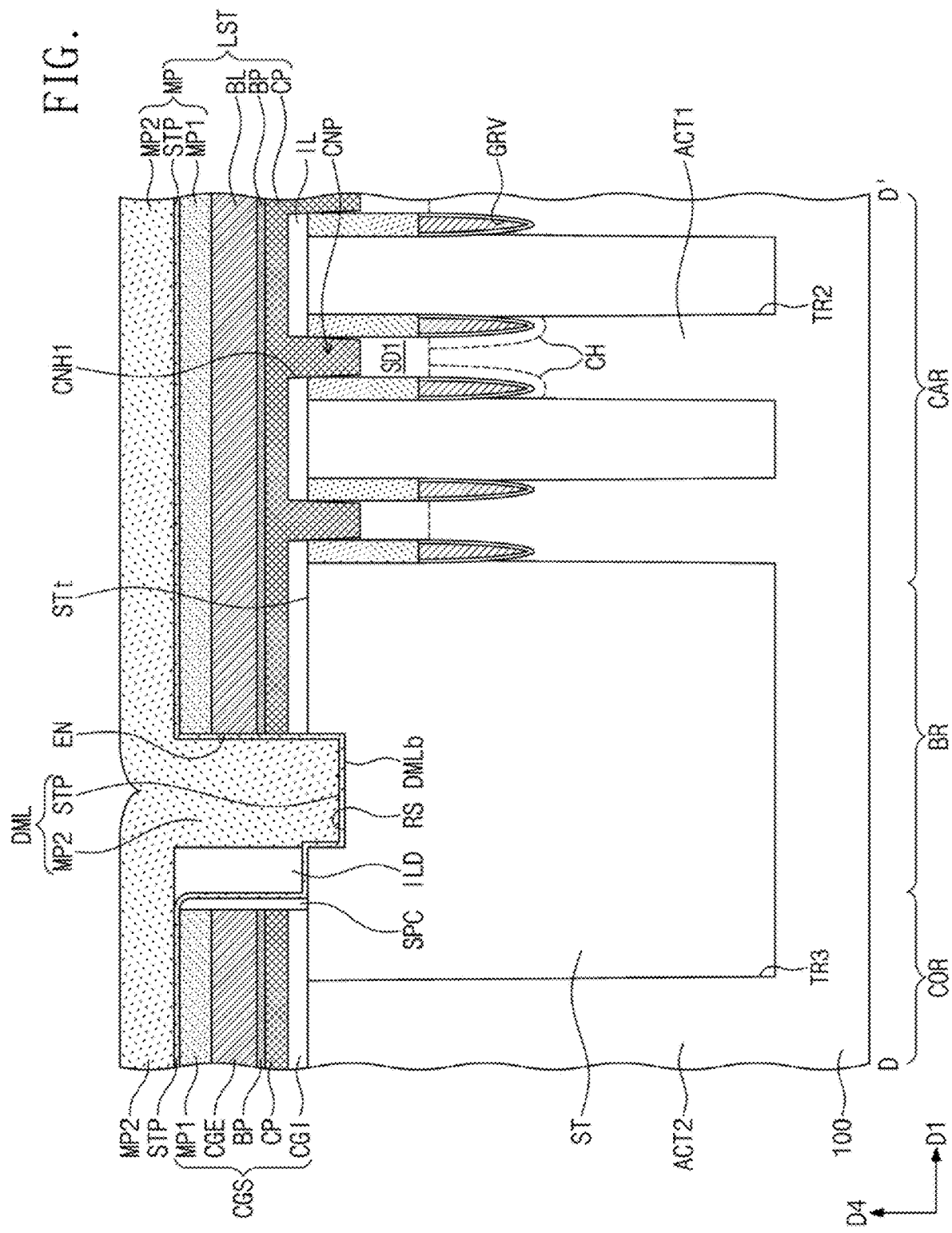
Figure 16E:
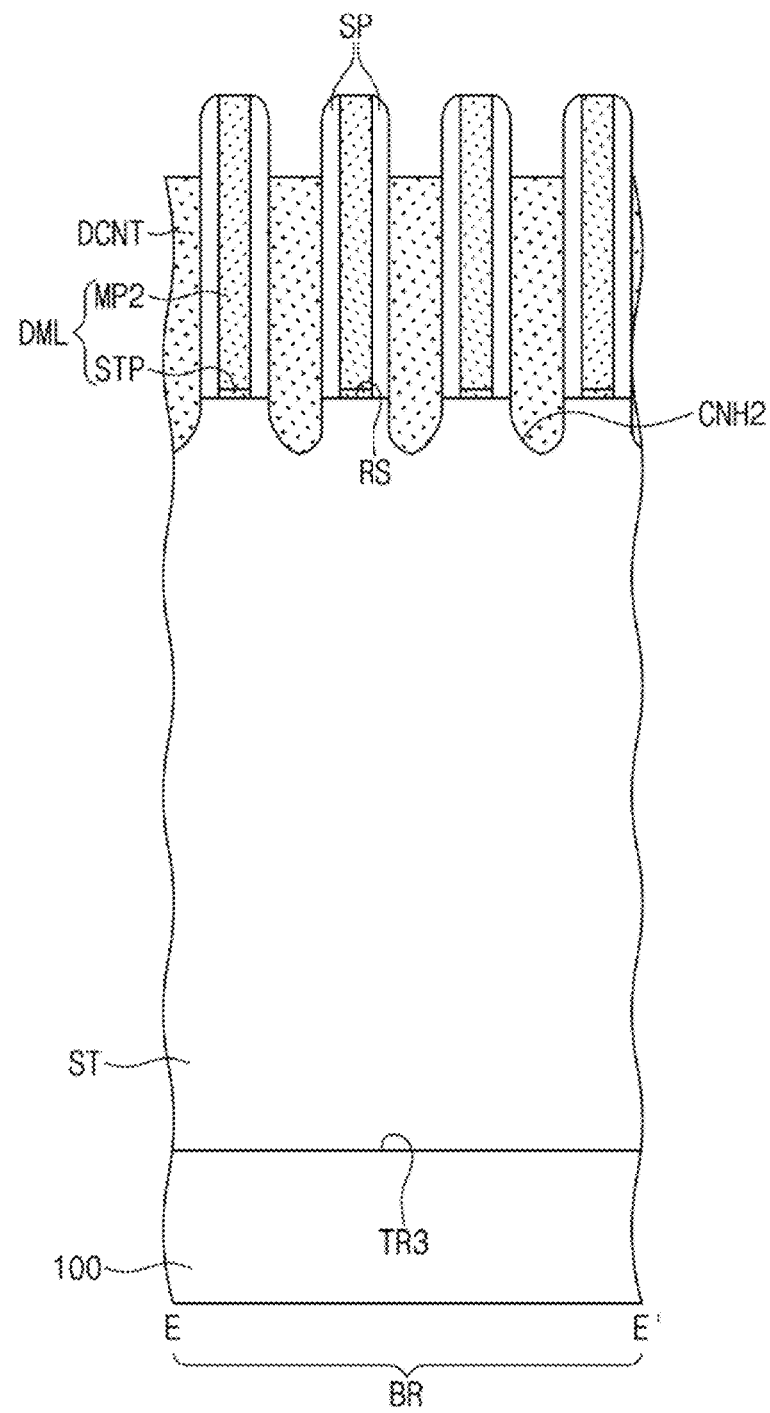

A pair of the spacers SP may be formed on opposite side surfaces of each of the capping pattern DML covering the line structure LST and the end EN thereof (e.g., see FIGS. 14A and 14E). The formation of the spacers SP may include conformally forming a spacer layer on the substrate 100 and anisotropically etching the spacer layer.

Referring to FIGS. 15 and 16A to 16E, an etching process using the spacers SP and the mask patterns MP as an etch mask may be performed on the entire surface of the substrate 100 to form the second contact holes CNH2 exposing the second source/drain regions SD2, respectively. In detail, the second contact hole CNH2 may be formed to penetrate the buffer layer IL and may be extended to a level lower than the top surface of the substrate 100. When the second contact hole CNH2 is formed, an upper portion of the second source/drain region SD2 may be recessed. When the second contact hole CNH2 is formed, an upper portion of the device isolation layer ST near the second source/drain region SD2 may also be recessed. The second contact holes CNH2 may be formed at both sides of the capping pattern DML on the boundary region BR (e.g., see FIG. 16E).

The insulating fences IFS may be formed between adjacent ones of the line structures LST. The insulating fences IFS may also be formed between adjacent ones of the capping patterns DML. The insulating fences IFS may not be overlapped with the second contact holes CNH2 and may expose the second contact holes CNH2.

The contacts CNT may be formed in the second contact holes CNH2, respectively, by filling the second contact holes CNH2 with a conductive material. The contacts CNT may be connected to the second source/drain regions SD2. In detail, the conductive material may be formed on the substrate 100, and then, the conductive material may be recessed such that the conductive material has a top surface lower than the top surfaces of the insulating fences IFS. Thus, the conductive material may be divided into the contacts CNT, which are respectively formed in the second contact holes CNH2, by the insulating fences IFS. The contacts CNT and the insulating fences IFS between adjacent ones of the line structures LST may be alternately arranged in the first direction D1.

The conductive material filling the second contact holes CNH2 may be a doped semiconductor material. For example, the conductive material may include doped poly silicon. The doped semiconductor material may be formed to fill the second contact holes CNH2, and then, impurities in the doped semiconductor material may be diffused into the second source/drain regions SD2. The diffusion of the impurity may be performed using a metallurgical process.

The conductive material filling the second contact hole CNH2 on the boundary region BR may form the dummy contact DCNT. The dummy contact DCNT may be a dummy element that is in contact with an upper portion of the device isolation layer ST.

Referring back to FIGS. 2 and 3A to 3E, the landing pads LP may be formed on the contacts CNT of the cell region CAR, respectively. In detail, a metal layer may be formed on the contacts CNT and the insulating fences IFS. The landing pads LP may be formed by patterning the metal layer. The insulating pattern INP may be formed by filling a space between the landing pads LP with an insulating material.

The data storing elements DS may be formed on the landing pads LP, respectively. The formation of the data storing element DS may include forming a bottom electrode on the landing pad LP, forming a dielectric layer to cover the bottom electrode, and forming a top electrode on the dielectric layer. Although not shown, one or more interconnection layers (e.g., M1, M2, M3, M4, and so forth) may be formed on the data storing elements DS.

Hereinafter, a method of forming the capping pattern DML on the boundary region BR, shown in FIG. 14D, will be described in more detail with reference to FIGS. 17 to 21.

Figure 12A:
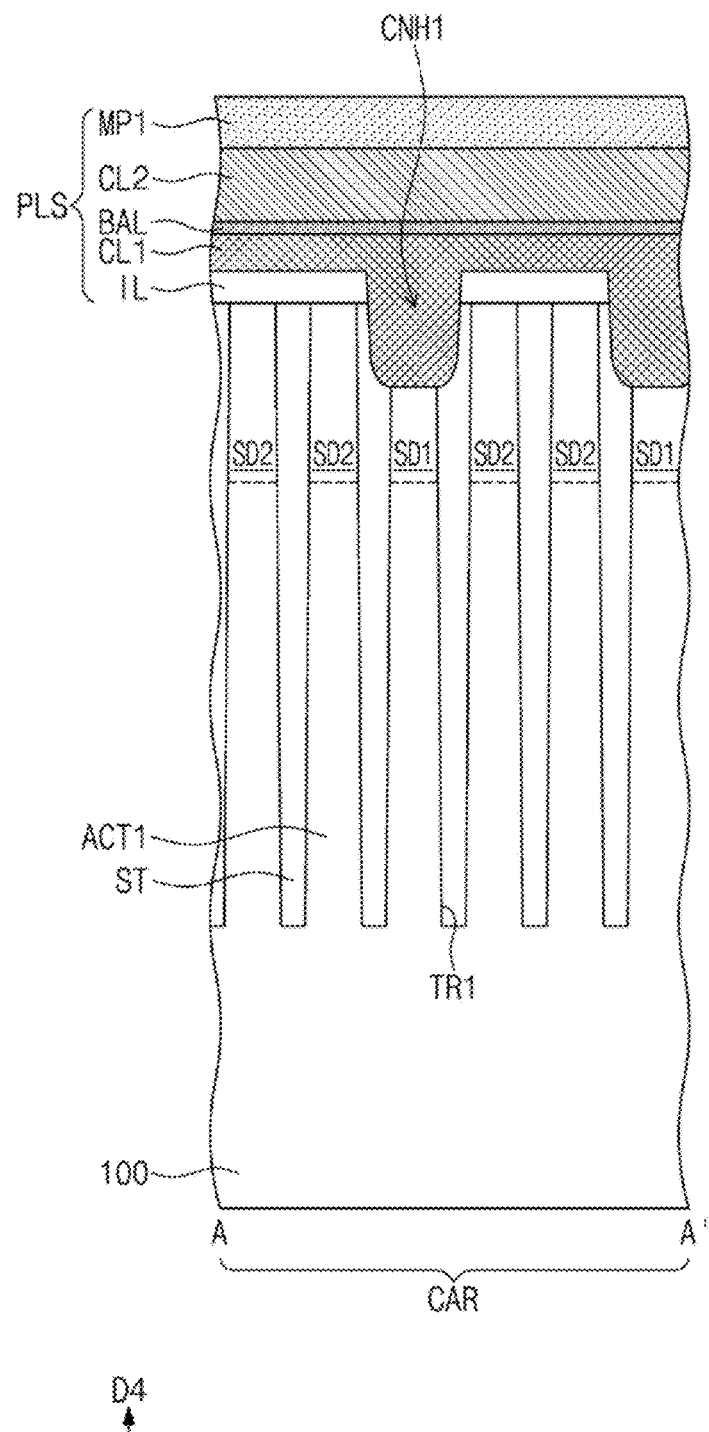
Figure 12B:
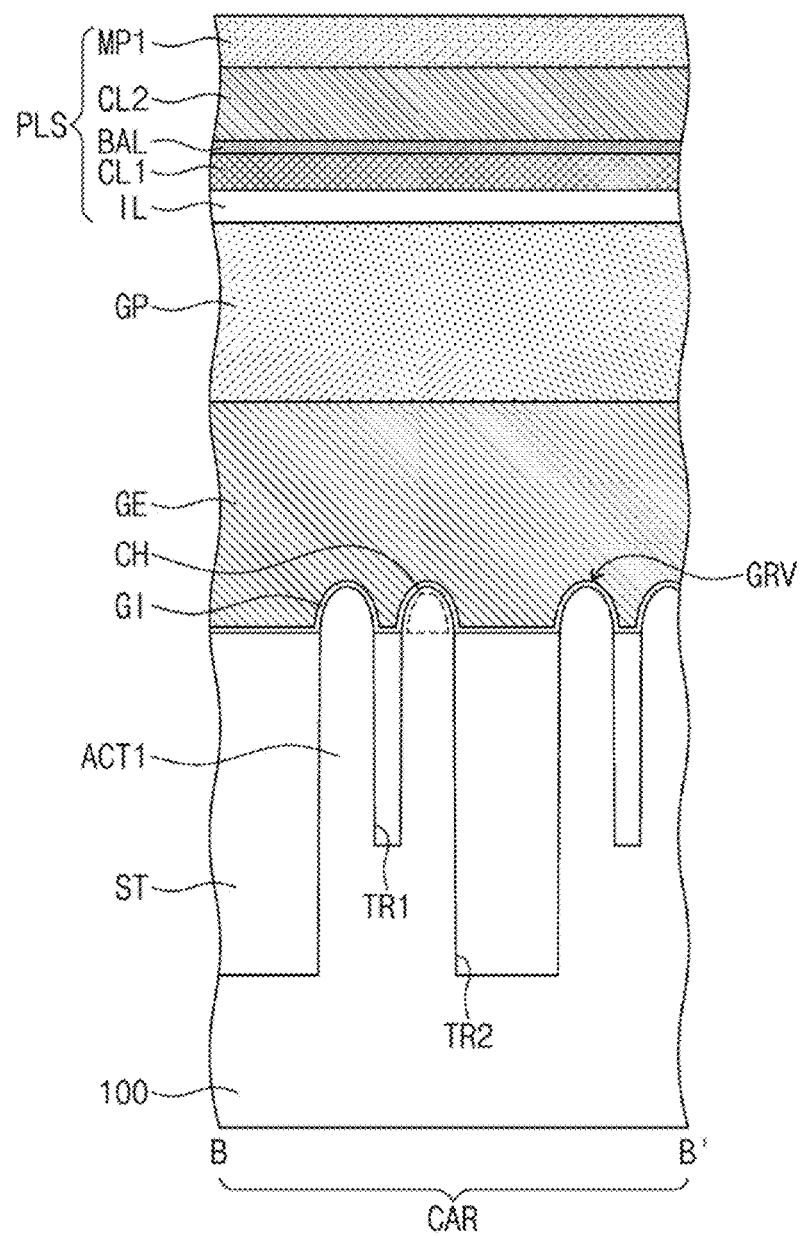
Figure 12C:
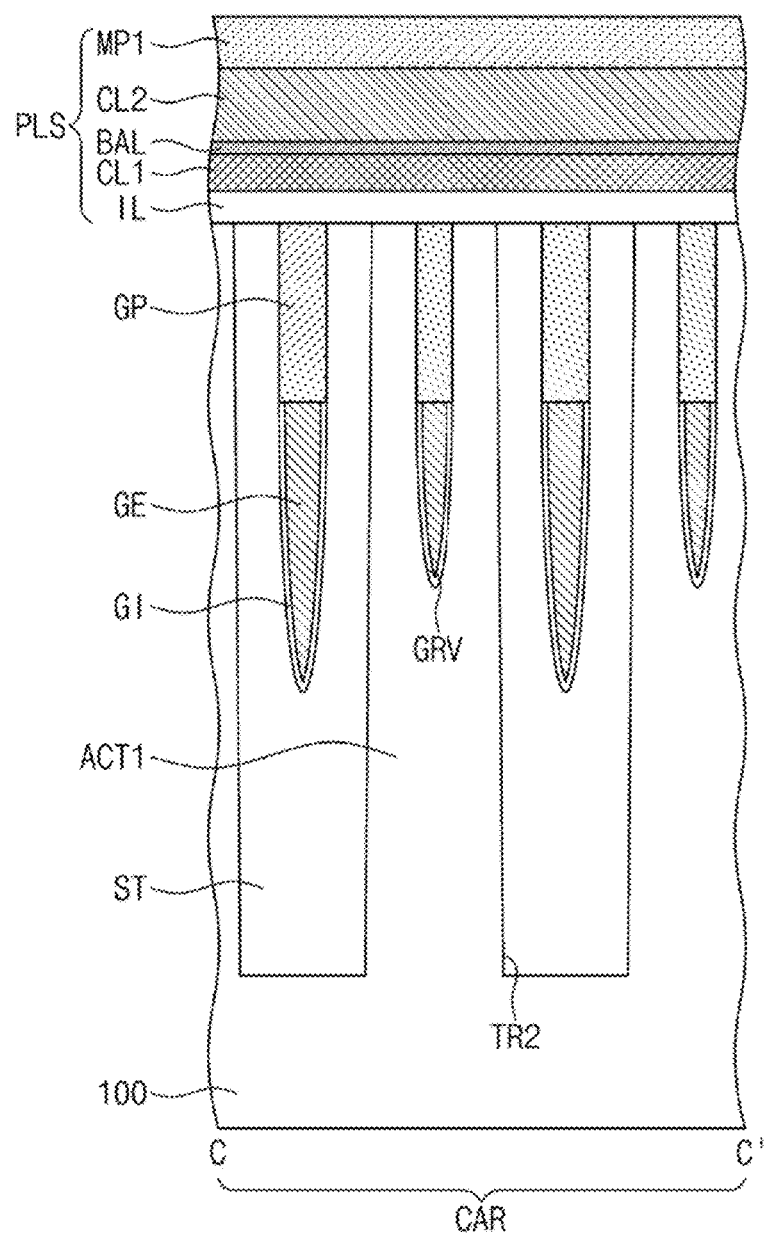
Figure 12D:
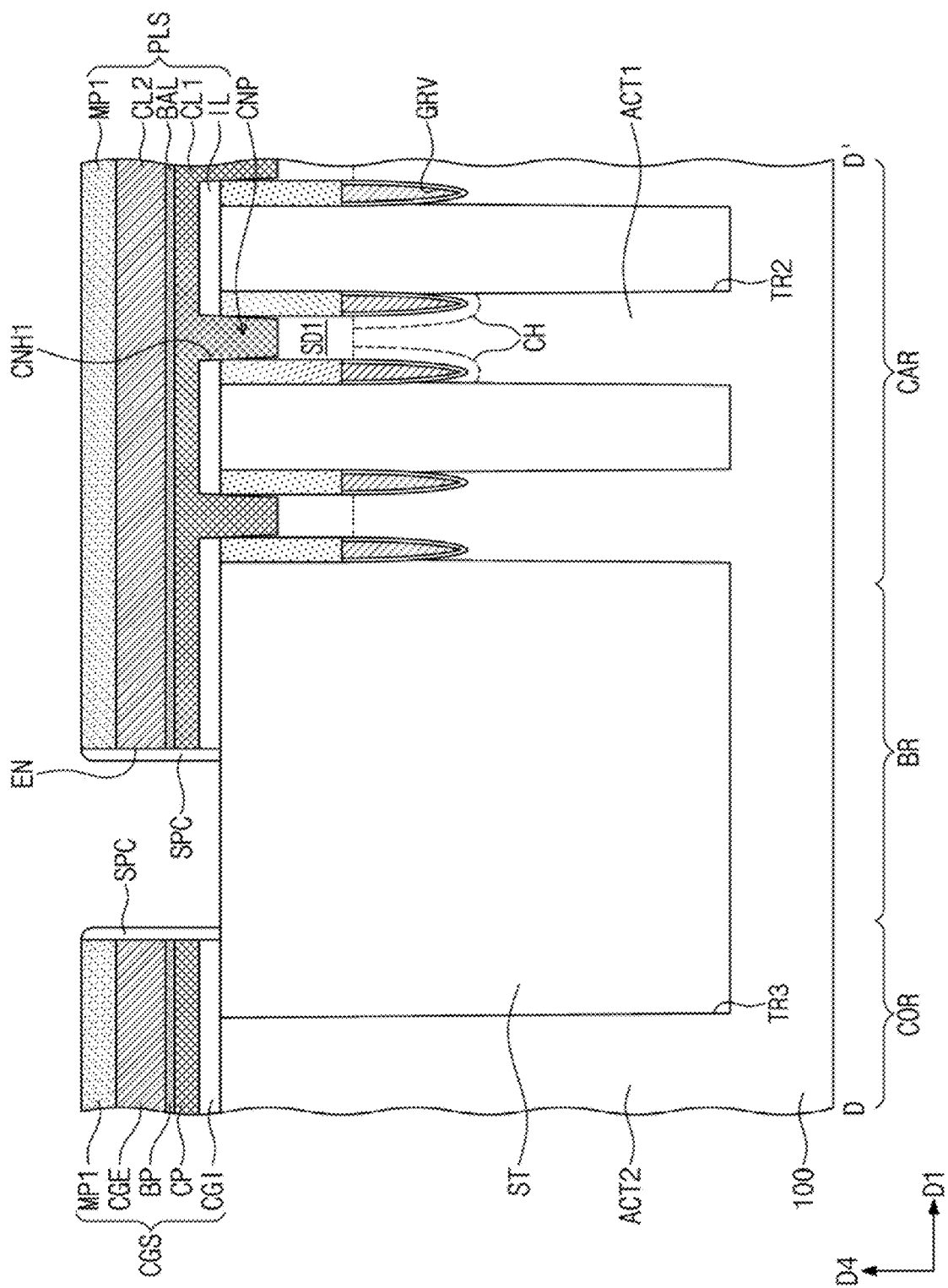
Figure 12E:
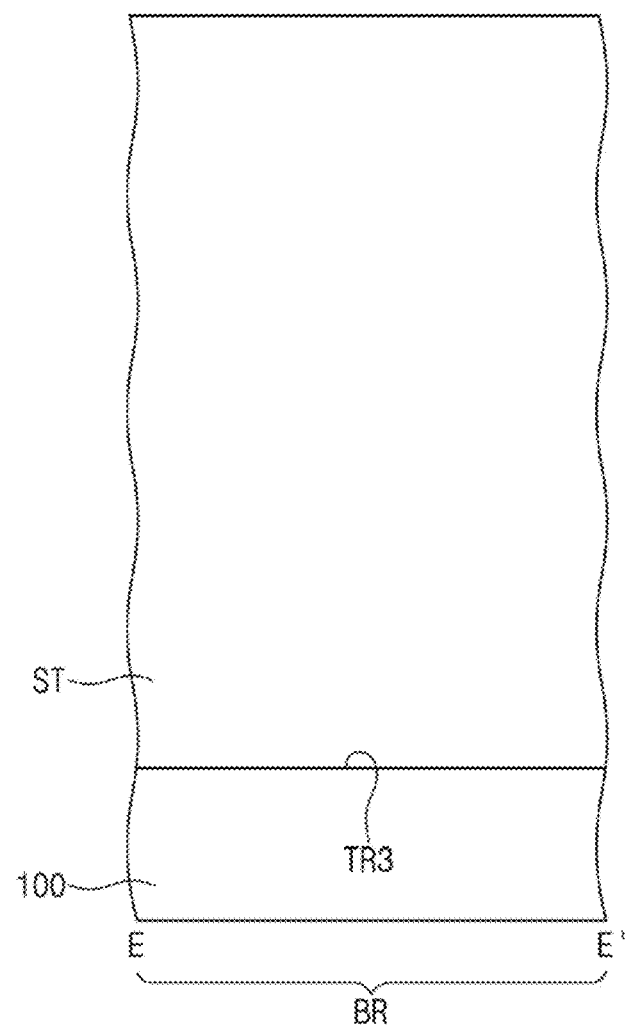
Figure 13:
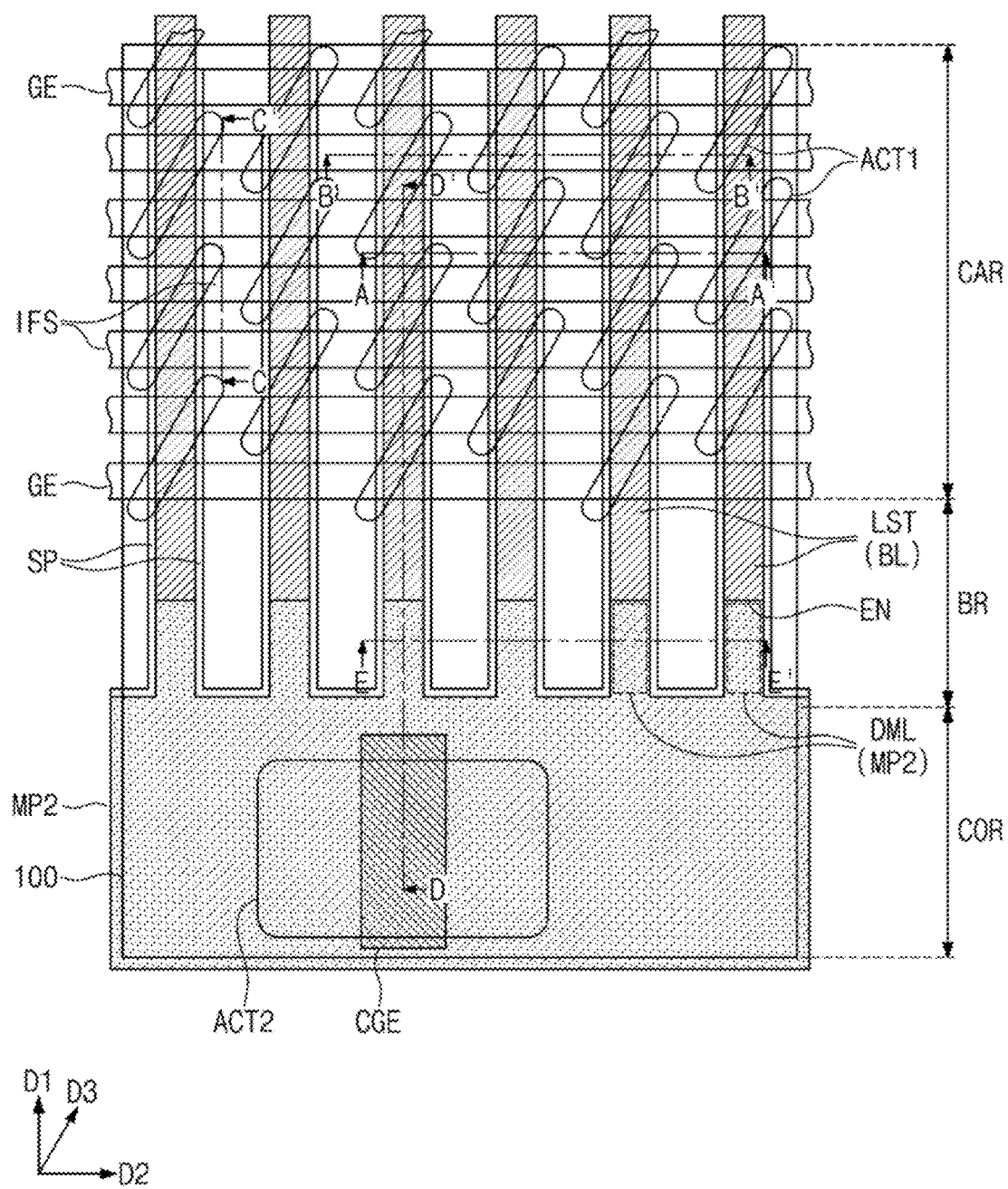
Figure 17:
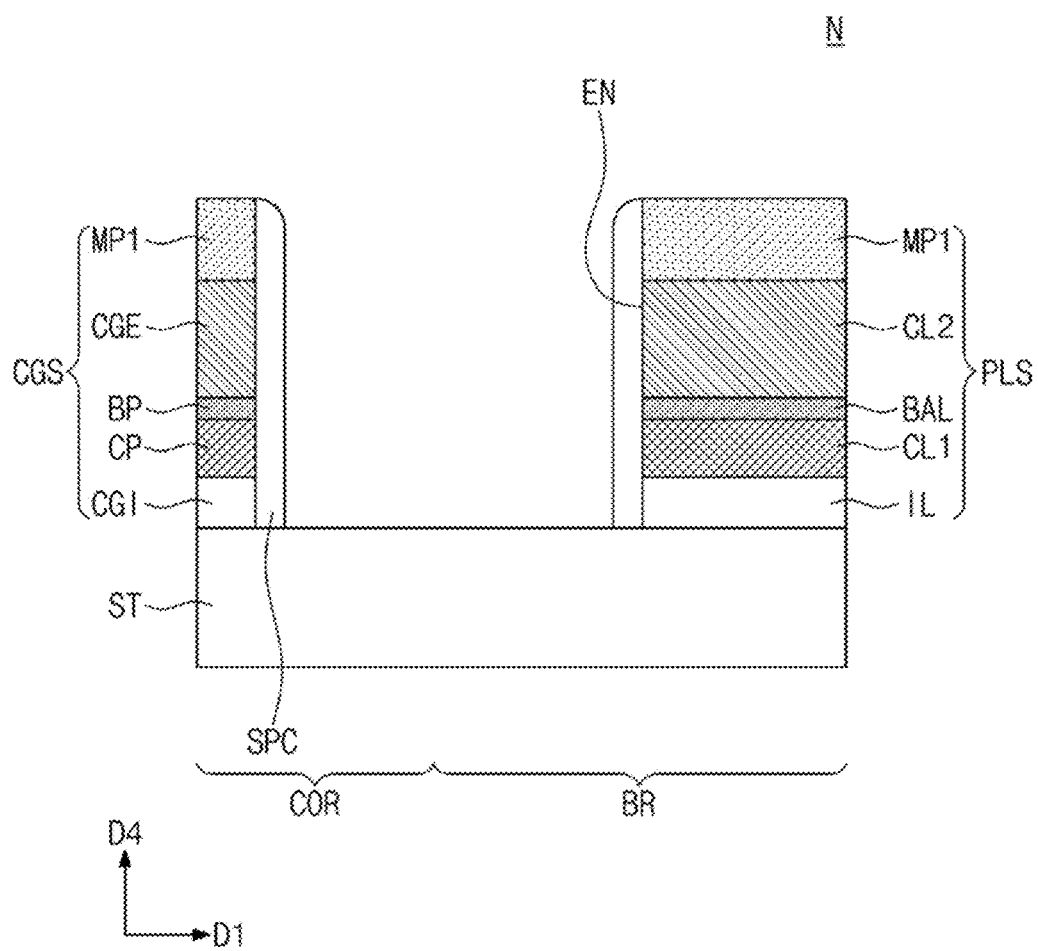
FIGS. 17, 18, 19, 20, and 21 are sectional views illustrating a method of forming a portion 'N' of FIG. 14D.

Referring to FIG. 17, the structure of FIG. 12D may be provided. In detail, the edge of the plate structure PLS may be provided on the device isolation layer ST of the boundary region BR. For example, an end EN of the plate structure PLS may be located on the device isolation layer ST of the boundary region BR. An edge of the core gate structure CGS may be provided on the device isolation layer ST of the core region COR. The sidewall spacers SPC may be respectively provided on the end EN of the plate structure PLS and the side surface of the core gate structure CGS.

Figure 18:
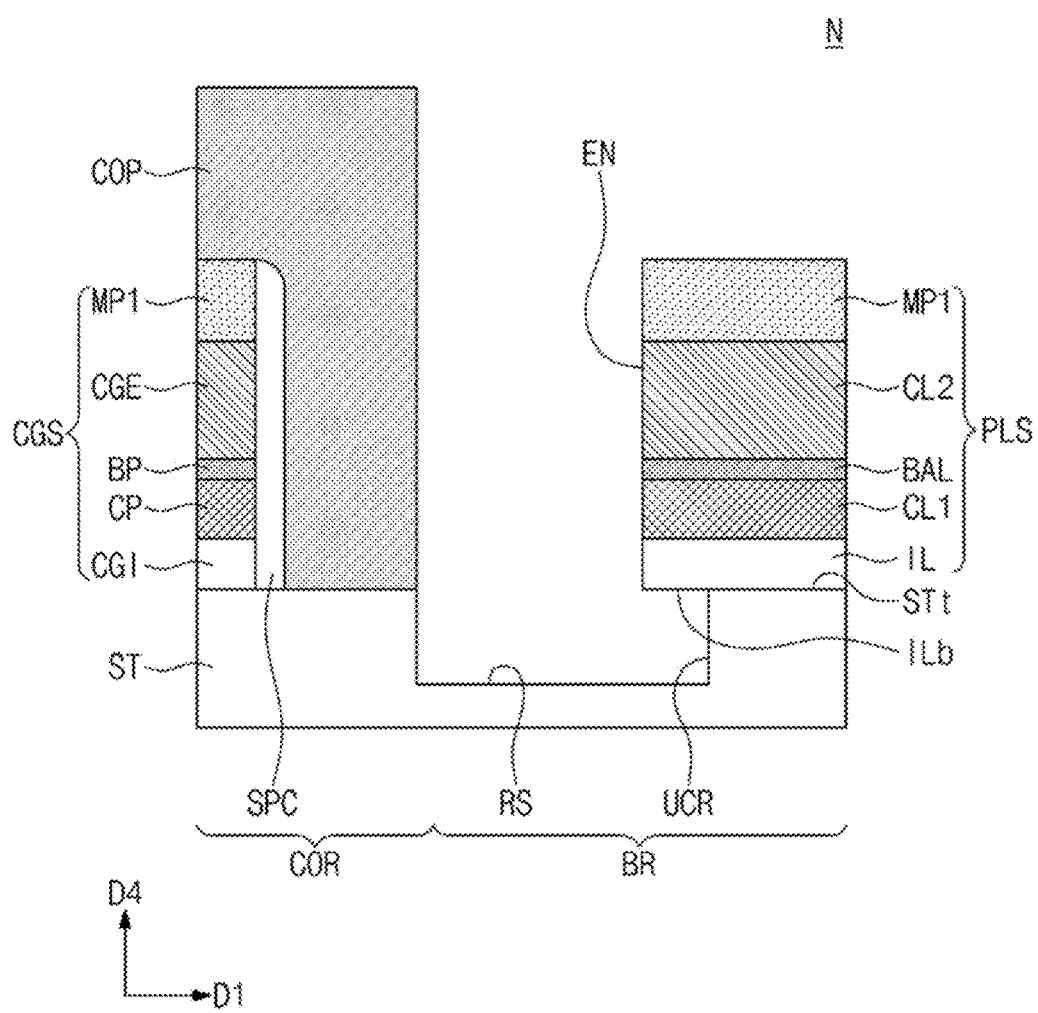

Referring to FIG. 18, a first etch mask pattern COP may be formed to cover the core region COR and to expose the boundary and cell regions BR and CAR. The first etch mask pattern COP may be formed using a photolithography process. The first etch mask pattern COP may cover the core gate structure CGS. The first etch mask pattern COP may expose the plate structure PLS.

A first etching process using the first etch mask pattern COP may be performed to remove the sidewall spacer SPC on the plate structure PLS. An upper portion of the device isolation layer ST on the boundary region BR may be etched during the removal of the sidewall spacer SPC. Since the upper portion of the device isolation layer ST is etched, the recess region RS may be formed. A bottom of the recess region RS may be lower than the top surface STt of the device isolation layer ST below the plate structure PLS. Meanwhile, the plate structure PLS may be protected by the first mask pattern MP1, and thus, the plate structure PLS may not be etched during the first etching process.

In some example embodiments, the first etching process may include a wet etching process that is performed using an etchant capable of selectively etching (e.g., configured to selectively etch) silicon oxide. As an example, the wet etching process may be performed using buffered hydrofluoric acid solution (BHF) or hydrofluoric acid solution (HF). During the first etching process, the recess region RS in the upper portion of the device isolation layer ST may be horizontally expanded, and as a result, the undercut region UCR may be formed. The undercut region UCR may be vertically overlapped with the plate structure PLS. The undercut region UCR may be formed to expose the bottom surface ILb of the buffer layer IL.

In some example embodiments, the first etching process may include a dry etching process. In detail, the first etch mask pattern COP may be formed in a shape of slit to expose only the boundary region BR and cover the core region COR and the cell region CAR. All of layers, which are exposed by the first etch mask pattern COP, may be anisotropically etched through the dry etching process. As a result, the end EN of the line structure LST may be vertically aligned to the inner sidewall RSw of the recess region RS, as previously described with reference to FIG. 5. In the case where the anisotropic etching process is used, it may be possible to neatly remove all of residues, which are formed near the device isolation layer ST of the boundary region BR to cause a failure in the first etching process.

Figure 19:
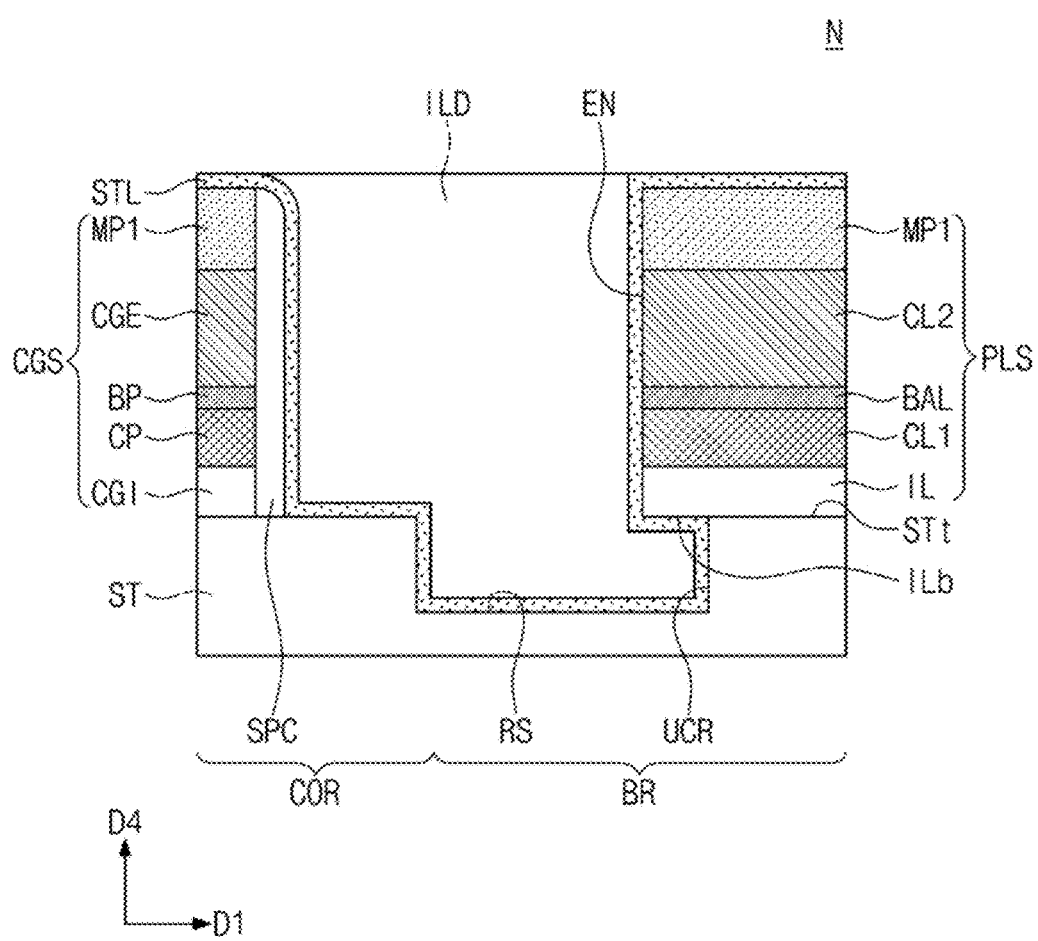

Referring to FIG. 19, the first etch mask pattern COP may be selectively removed. A stopper layer STL may be conformally formed on the substrate 100. The stopper layer STL may cover the end EN of the plate structure PLS. The stopper layer STL may cover the top surface of the device isolation layer ST on the boundary region BR. The stopper layer STL may cover the core gate structure CGS and the sidewall spacer SPC.

The stopper layer STL may partially fill the recess region RS and the undercut region UCR. For example, the stopper layer STL may cover the exposed bottom surface ILb of the buffer layer IL. In some example embodiments, the stopper layer STL may include a silicon nitride layer.

The interlayer insulating layer ILD may be formed on the stopper layer STL. The interlayer insulating layer ILD may fill a space between the core gate structure CGS and the plate structure PLS. A planarization process may be performed on the interlayer insulating layer ILD to expose the topmost surface of the stopper layer STL.

Figure 20:
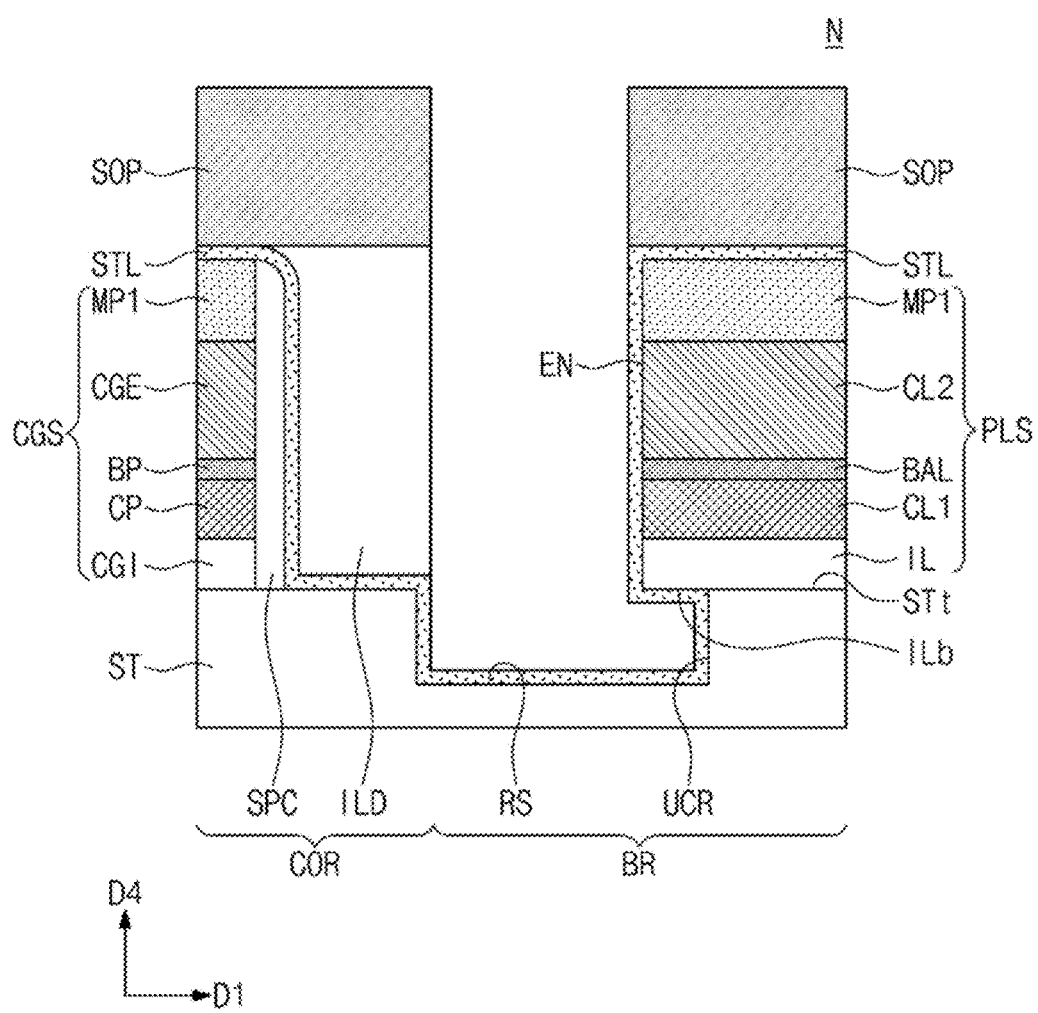

Referring to FIG. 20, a second etch mask pattern SOP may be formed to expose only the boundary region BR and to cover the core region COR and the cell region CAR. For example, the second etch mask pattern SOP may expose a portion of the interlayer insulating layer ILD placed on the recess region RS.

A second etching process using the second etch mask pattern SOP may be performed to remove the portion of the interlayer insulating layer ILD exposed by the second etch mask pattern SOP. The second etching process may include a wet etching process that is performed using an etchant capable of selectively etching silicon oxide. Accordingly, the interlayer insulating layer ILD in the recess region RS and the undercut region UCR may be clearly removed. Only the stopper layer STL may be left in the recess region RS and the undercut region UCR.

As a result of the second etching process, the stopper layer STL covering the end EN of the plate structure PLS may be exposed to the outside. An oxide layer (e.g., the interlayer insulating layer ILD) on the stopper layer STL may be fully removed.

Figure 21:
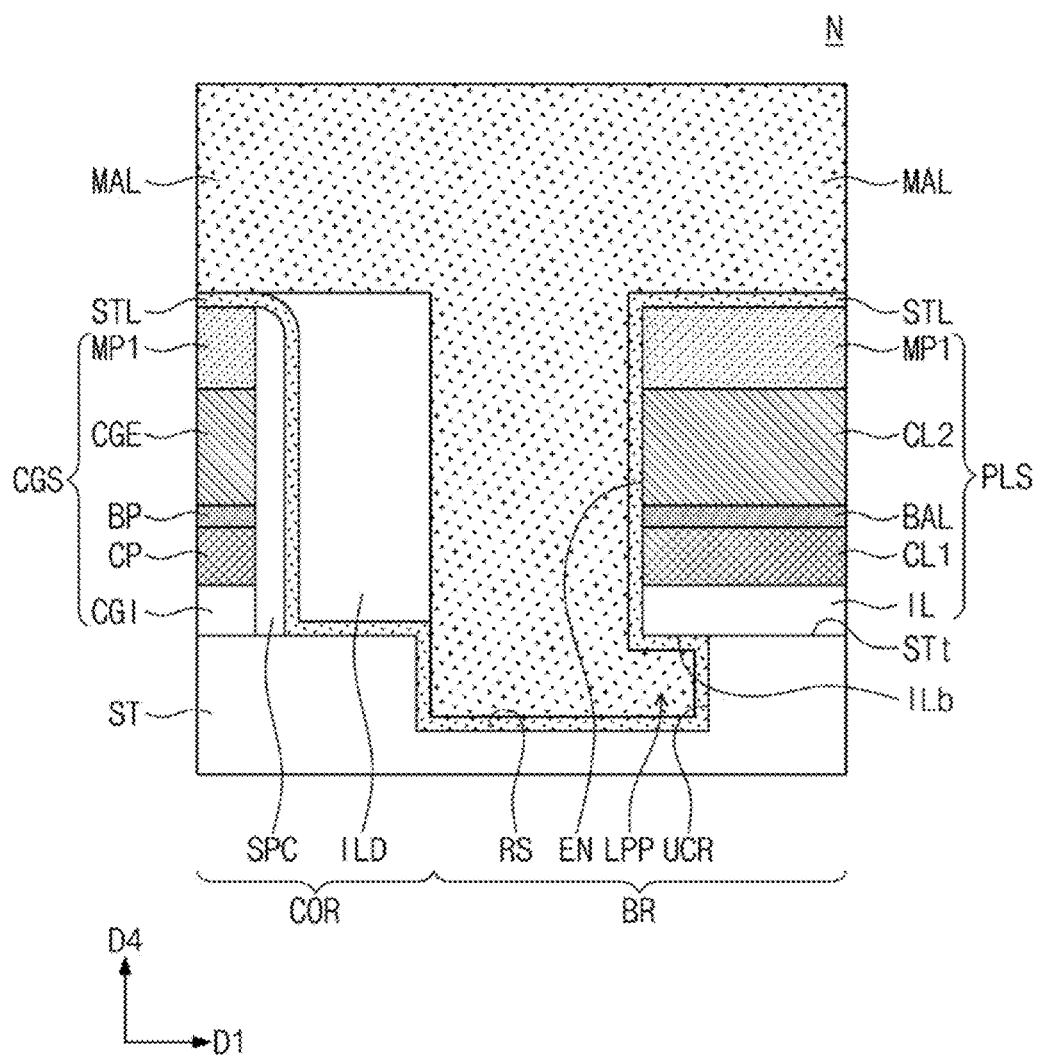

Referring to FIG. 21, the second etch mask pattern SOP may be selectively removed. A second mask layer MAL may be formed on the stopper layer STL. In some example embodiments, the second mask layer MAL may include a silicon nitride layer.

The second mask layer MAL may be provided to fully fill the recess region RS and the undercut region UCR. The second mask layer MAL filling the undercut region UCR may be used as the lower protruding portion LPP previously described with reference to FIG. 4.

Thereafter, referring back to FIGS. 13, 14D, and 14E, the second mask layer MAL may be patterned to form the second mask pattern MP2. The line structures LST may be formed by patterning the plate structure PLS using the second mask pattern MP2 as an etch mask.

In a comparative example, the sidewall spacer SPC may be left on the end EN of the plate structure PLS, as shown in FIG. 17, and in this case, the second conductive layer CL2 may be exposed to an oxygen environment, which is caused by the sidewall spacer SPC, during a process of patterning the plate structure PLS. If the second conductive layer CL2 is exposed to the oxygen environment during its patterning process, the bit line BL may be formed to have a reduced linewidth, and in certain cases, a process defect, in which the bit line BL is not extended to the boundary region BR, may occur.

By contrast, according to some example embodiments of the inventive concepts, since all of the second mask layer MAL and the stopper layer STL constituting the capping pattern DML include the silicon nitride layer, any oxide layer may not be formed near the end EN of the plate structure PLS. In particular, since the end EN of the plate structure PLS is fully encapsulated by the second mask layer MAL and the stopper layer STL, it may be possible to prevent the end EN of the plate structure PLS from being exposed to an oxygen environment during the process of patterning the second conductive layer CL2. Accordingly, it may be possible to prevent the linewidth of the bit line BL from being reduced and to stably extend the bit line BL to the boundary region BR. As a result, the reliability of the semiconductor device may be improved.

According to some example embodiments of the inventive concepts, a capping pattern may be provided to encapsulate an end of a line structure on a boundary region. A capping structure may prevent a bit line of the line structure from being exposed to an oxygen environment, and in this case, it may be possible to reduce or prevent the occurrence of a process defect (e.g., a process defect that might result from such exposure), such as a reduction of a linewidth of the bit line. As a result, it may be possible to improve reliability of a semiconductor device based at least in part upon the capping pattern encapsulating an end of the line structure on the boundary region.

While some example embodiments of the inventive concepts have been particularly shown and described, it will be understood by one of ordinary skill in the art that variations in form and detail may be made therein without departing from the spirit and scope of the attached claims.

What is claimed is:
1. A semiconductor device, comprising:
   a substrate including
      a cell region including a first active pattern,
      a core region including a second active pattern, and
      a boundary region between the cell region and the core region,
      wherein the first active pattern and the second active pattern have respective, opposing sidewall surfaces at least partially defining a trench between the first active pattern and the second active pattern;
   a device isolation layer on the boundary region, the device isolation layer filling the trench between the first active pattern and the second active pattern;

a line structure on the first active pattern, the line structure extended from the cell region to the boundary region; and a capping pattern covering an end of the line structure on the boundary region, wherein the device isolation layer includes one or more inner surfaces at least partially defining a recess region, which is adjacent to the end of the line structure, wherein the capping pattern is extended along the end of the line structure into the recess region, wherein a top surface of the device isolation layer is between the line structure and a bottom surface of the capping pattern, and wherein a lowermost surface of the capping pattern extends below a bottom surface of the line structure.

2. The semiconductor device of claim 1, wherein
the recess region comprises an undercut region that is horizontally extended,
the capping pattern comprises a lower protruding portion filling the undercut region, and
the lower protruding portion is below the line structure and is vertically overlapped with at least a portion of the line structure.

3. The semiconductor device of claim 1, further comprising:
a gate electrode in a groove of an upper portion of the first active pattern, the gate electrode being between a first source/drain region of the first active pattern and a second source/drain region of the first active pattern;
a contact plug on the second source/drain region; and
a data storing element on the contact plug,
wherein the first source/drain region is electrically connected to the line structure.

4. The semiconductor device of claim 3, wherein the data storing element comprises a capacitor.

5. The semiconductor device of claim 3, further comprising a dummy contact plug at a side of the capping pattern.

6. The semiconductor device of claim 1, wherein
the line structure is extended in a first direction extending parallel to a top surface of the substrate,
the capping pattern is extended in the first direction, and
the capping pattern at least partially overlaps the line structure in the first direction.

7. The semiconductor device of claim 1, further comprising:
a core gate structure on the second active pattern; and
a sidewall spacer on the boundary region to cover a side surface of the core gate structure,
wherein the end of the line structure is directly covered with the capping pattern without the sidewall spacer being between the end of the line structure and the capping pattern.

8. The semiconductor device of claim 7, wherein
the capping pattern comprises a stopper pattern and a mask pattern, and
the stopper pattern and the mask pattern are extended from the cell region to the core region through the boundary region to cover the line structure, the core gate structure, and the device isolation layer.

9. The semiconductor device of claim 8, wherein the stopper pattern and the mask pattern comprise silicon nitride.

10. The semiconductor device of claim 1, wherein the line structure comprises a conductive pattern, a barrier pattern, and a bit line, which are sequentially stacked on a buffer layer of the cell region.

11. A semiconductor device, comprising:
a substrate including
a cell region including a first active pattern,
a core region including a second active pattern, and
a boundary region between the cell region and the core region,
wherein the first active pattern and the second active pattern have respective, opposing sidewall surfaces at least partially defining a trench between the first active pattern and the second active pattern;
a device isolation layer on the boundary region, the device isolation layer filling the trench between the first active pattern and the second active pattern;
a line structure on the first active pattern, the line structure extended from the cell region to the boundary region;
a core gate structure on the second active pattern;
a sidewall spacer on the boundary region to cover a side surface of the core gate structure; and
a capping pattern on the boundary region to cover an end of the line structure,
wherein the capping pattern comprises a material different from a material of the sidewall spacer, and
wherein a lowermost surface of the capping pattern extends below a bottom surface of the line structure.

12. The semiconductor device of claim 11, wherein
the sidewall spacer comprises silicon oxide, and
the capping pattern comprises silicon nitride.

13. The semiconductor device of claim 11, wherein a top surface of the device isolation layer is between the line structure and a bottom surface of the capping pattern.

14. The semiconductor device of claim 13, wherein
the capping pattern comprises a lower protruding portion extended to a region below the line structure, and
the lower protruding portion is vertically overlapped with at least a portion of the line structure.

15. The semiconductor device of claim 11, wherein the end of the line structure is encapsulated by the capping pattern and is not encapsulated by the sidewall spacer.

16. A semiconductor device, comprising:
a substrate including
a cell region including a first active pattern,
a core region including a second active pattern, and
a boundary region between the cell region and the core region,
wherein the first active pattern has a longitudinal axis in a first direction extending parallel to a top surface of the substrate and includes a first source/drain region and a second source/drain region spaced apart from each other in the first direction, the first source/drain region and the second source/drain region having respective, opposing sidewall surfaces at least partially defining a groove between the first and second source/drain regions of the first active pattern;
a gate electrode in the groove defined between the first and second source/drain regions of the first active pattern and is extended in a second direction that is different than the first direction;
a gate dielectric layer between the gate electrode and the first active pattern;
a gate capping layer on the gate electrode to fill the groove;
a device isolation layer on the substrate to define the first active pattern and the second active pattern;

a buffer layer on the cell region;
a line structure on the buffer layer to cross the first active pattern and extend in a third direction crossing the second direction and is extended from the cell region to the boundary region, the line structure including
    a first conductive pattern, which penetrates the buffer layer and is coupled to the first source/drain region,
    a bit line on the first conductive pattern, and
    a first barrier pattern between the bit line and the first conductive pattern;
a pair of spacers, which are respectively on opposite side surfaces of the line structure;
a contact plug coupled to the second source/drain region;
a landing pad on the contact plug;
a data storing element on the landing pad;
a core gate structure on the second active pattern, the core gate structure including
    a second conductive pattern corresponding to the first conductive pattern,
    a second barrier pattern corresponding to the first barrier pattern, and
    a core gate electrode corresponding to the bit line;
a sidewall spacer on a side surface of the core gate structure; and
a capping pattern covering an end of the line structure on the boundary region,
wherein a lowermost surface of the capping pattern extends below a bottom surface of the line structure.

17. The semiconductor device of claim 16, wherein the pair of spacers are extended from the opposite side surfaces of the line structure to opposite side surfaces of the capping pattern.

18. The semiconductor device of claim 16, wherein the capping pattern comprises a material different from the sidewall spacer.

19. The semiconductor device of claim 16, wherein a top surface of the device isolation layer is between the line structure and a bottom surface of the capping pattern.

20. The semiconductor device of claim 16, wherein the data storing element comprises a capacitor.

* * * * *